(12) United States Patent
Tsukagoshi et al.

(10) Patent No.: US 7,528,488 B2
(45) Date of Patent: May 5, 2009

(54) METHOD FOR CONNECTING ELECTRODES, SURFACE-TREATED WIRING BOARD AND ADHESIVE FILM USED IN THE METHOD, AND ELECTRODE-CONNECTED STRUCTURE

(75) Inventors: Isao Tsukagoshi, Tokyo (JP); Yasushi Gotou, Shimodate (JP); Masami Yusa, Tsukuba (JP); Yasuo Miyadera, Tsukuba (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 240 days.

(21) Appl. No.: 11/494,708

(22) Filed: Jul. 28, 2006

(65) Prior Publication Data

US 2006/0263599 A1 Nov. 23, 2006

Related U.S. Application Data

(62) Division of application No. 10/345,166, filed on Jan. 16, 2003, now Pat. No. 7,258,918.

(30) Foreign Application Priority Data

| Feb. 28, 2002 | (JP) | ................. 2002-53910 |
| Feb. 28, 2002 | (JP) | ................. 2002-53911 |

(51) Int. Cl.
H01L 23/52 (2006.01)
(52) U.S. Cl. ...................... 257/753; 257/750
(58) Field of Classification Search ................ 428/354; 257/750, 753; 528/271
See application file for complete search history.

(56) References Cited

U.S. PATENT DOCUMENTS

| 3,371,128 A | 2/1968 | Neuse et al. |
| 4,652,608 A | 3/1987 | Parker |
| 4,786,569 A | 11/1988 | Rohde et al. |
| 5,494,764 A | 2/1996 | Hyodo |
| 6,316,170 B2 * | 11/2001 | Kawamonzen et al. ...... 430/330 |

FOREIGN PATENT DOCUMENTS

JP 51-105827 9/1976
JP 10-298278 11/1998
JP 2002-241591 8/2002

* cited by examiner

*Primary Examiner*—Thao T. Tran
(74) *Attorney, Agent, or Firm*—Antonelli, Terry, Stout & Kraus, LLP.

(57) ABSTRACT

The present invention relates to a method for connecting electrodes comprising: interposing the polyphthalide represented by the formula (I):

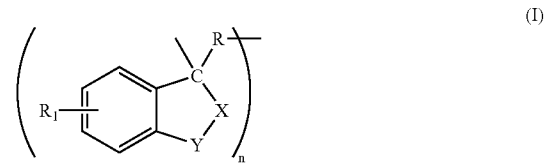

wherein R represents a divalent aromatic hydrocarbon group or a divalent heteroring-containing aromatic group, $R_1$ represents an alkyl group, a fluorinated alkyl group, an alkoxy group or a halogen atom, where the number of $R_1$ is 0 to 4, X represents O or N—$R_3$, provided that $R_3$ represents one of the following groups,

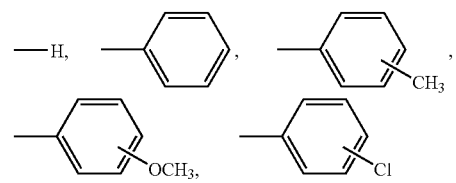

Y represents $SO_2$ or Co and n represents a number of repeating units in the polymer,
as a pressure-sensitive conductive polymer at least partially between electrodes opposed to each other; and applying a pressure to fix the both electrodes, a surface-treated wiring board comprising polyphthalide represented by the formula (I) formed on at least part of the surface of the electrode part, an adhesive film comprising an adhesive and polyphthalide represented by the formula (I), and an electrode-connected structure using the same.

7 Claims, 5 Drawing Sheets

(a)  (b)

METHOD FOR CONNECTING ELECTRODES, SURFACE-TREATED WIRING BOARD AND ADHESIVE FILM USED IN THE METHOD, AND ELECTRODE-CONNECTED STRUCTURE

This application is a Divisional application of prior application Ser. No. 10/345,166, filed Jan. 16, 2003, now U.S. Pat. No. 7,258,918, the contents of which are incorporated herein by reference in their entirety.

FIELD OF THE INVENTION

The present invention relates to a method for connecting, electrodes, in which a wiring board having mounted thereon electronic parts is connected to another wiring board or electronic part, such as a semiconductor chip, a wiring board used in the method, and an adhesive film which is advantageously used for electrically or mechanically connecting an electrode to another. More particularly, the present invention relates to an adhesive film which is advantageously used as an adhesive film for bonding together an IC chip and a substrate which will have mounted thereon the chip or for connecting or bonding together electric circuits, and an electrodes-connected structure using the same.

BACKGROUND ART

Accompanied by a trend in favor of a small-sized and thinner-shaped electronic parts, circuits and electrodes (hereinafter, referred to as "electrode(s)") used in such electronic parts are required to have a higher density and higher precision.

For connecting such an electrode to another, a method has been known which comprises using an anisotropically conductive adhesive, obtained by dispersing conductive particles such as carbon, nickel, and a metal-coated plastic in an insulating adhesive, or a film thereof and applying a pressure while heating to achieve electrical connection in a thickness direction of the adhesive (see, for example, Japanese Prov. Patent Publication No. 104007/1980).

However, in the anisotropically conductive adhesive containing conductive particles, each conductive particle must have a particle diameter not larger than the space between the adjacent electrodes (hereinafter, referred to as "space"), and further, at least one conductive particle is needed per electrode, thereby limiting the degree of density and precision. Specifically, when the particle diameter of the conductive particles is reduced for improving the probability of the conductive particles present on each fine-structured electrode, the particles are likely to suffer aggregation to cause short-circuiting between the electrodes. In contrast, when the particle diameter of the conductive particles is increased, the probability of the conductive particles present on each fine-structured electrode is disadvantageously lowered.

On the other hand, there has been a method for connecting electrodes without using conductive particles, which comprises applying a pressure onto electrodes having microscopically uneven surfaces so as to remove an unnecessary adhesive and achieve electrical connection thereby (see, for example, Japanese Prov. Patent Publication No. 262430/1985).

However, when no conductive particle is used, a problem arises such that the reliability of connection between a number of electrodes becomes insufficient because the method fails to deal with uneven heights of the electrodes.

Further, when the surface of the electrode on the wiring board having an insulating part and an electrode part is exposed, the electrode disadvantageously suffers corrosion. Therefore, the surface of the electrode is conventionally subjected to anticorrosion-treatment, using a chelating agent, benzotriazole, etc.

However, the anticorrosive agent used for the electrode surface has an insulating property, and therefore it must be removed by washing before connecting electrodes, thereby causing an oxidation in the electrodes immediately before the connection and making the process more complicating.

In the present invention, there are provided a method for electrically connecting electrodes, which can deal with a trend of a higher density and higher precision of the electrodes without using conventional conductive particles, a surface-treated wiring board used in the method, which can prevent the electrode surface from suffering corrosion, an adhesive film which can electrically connect electrodes with a higher density and a higher precision even when the electrodes have uneven heights, and an electrodes-connected structure using them.

DISCLOSURE OF THE INVENTION

The present invention relates to [1] a method for connecting electrodes comprising:
interposing a pressure-sensitive conductive polymer at least partially between electrodes opposed to each other; and
applying a pressure to fix the both electrodes.

The present invention also relates to [2] a method for connecting electrodes comprising:
interposing polyphthalide as a pressure-sensitive conductive polymer at least partially between electrodes opposed to each other; and
applying a pressure to fix the both electrodes.

The present invention further relates to [3] the method for connecting electrodes according to [2], wherein the polyphthalide is represented by the formula (I):

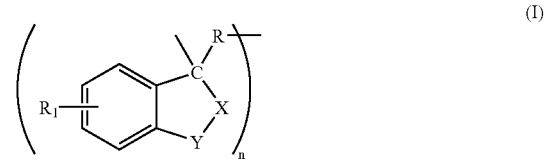

wherein R represents a divalent aromatic hydrocarbon group or a divalent heterring containing aromatic group, $R_1$ represents an alkyl group, a fluorinated alkyl group, an alkoxy group or a halogen atom, where the number of $R_1$ is 0 to 4, X represents O or N—$R_3$, provided that $R_3$ represents one of the following groups,

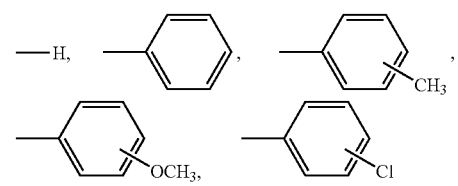

Y represents $SO_2$ or CO and n represents a number of repeating units in the polymer.

Further, the present invention relates to [4] a surface-treated wiring board comprising a substrate and at least one electrode, wherein polyphthalide is formed on at least part of the surface of the electrode part.

The present invention relates to [5] the surface-treated wiring board according [4], wherein the polyphthalide is represented by the formula (I):

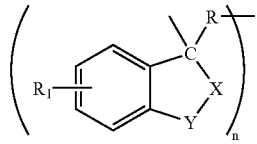

wherein R represents a divalent aromatic hydrocarbon group or a divalent heteroring-containing aromatic group, $R_1$ represents an alkyl group, a fluorinated alkyl group, an alkoxy group or a halogen atom, where the number of $R_1$ is 0 to 4, X represents O or N—$R_3$, provided that $R_3$ represents one of the following groups,

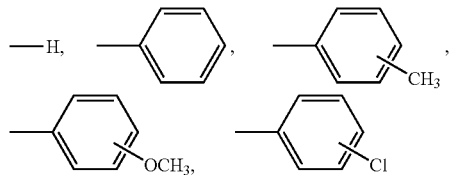

Y represents $SO_2$ or CO and n represents a number of repeating units in the polymer.

Further, the present invention relates to [6] a method for connecting electrodes comprising:
disposing the surface-treated wiring board with polyphthalide formed thereon according to [4] or [5] and other electronic part, in a manner that electrodes thereof face each other; and
applying a pressure to fix the both electrodes; provided that at least one of the electrodes opposed to each other is projected from a surface of the substrate.

The present invention also relates to [7] the method for connecting electrodes according to [6], wherein the both electrodes are fixed by a mechanical means or by an adhesive.

Further, the present invention relates to [8] an adhesive film comprising an adhesive and a pressure-sensitive conductive polymer.

Still further, the present invention relates to [9] an adhesive film comprising an adhesive and polyphthalide as a pressure-sensitive conductive polymer.

Yet further, the present invention relates to [10] the adhesive film according to [9], wherein the polyphthalide is represented by the formula (I):

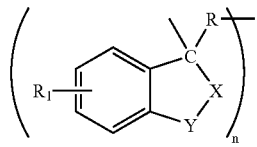

wherein R represents a divalent aromatic hydrocarbon group or a divalent heteroring-containing aromatic group, $R_1$ represents an alkyl group, a fluorinated alkyl group, an alkoxy group or a halogen atom, where the number of $R_1$ is 0 to 4, X represents O or N—$R_3$, provided that $R_3$ represents one of the following groups,

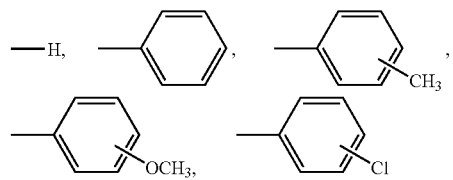

Y represents $SO_2$ or CO and n represents a number of repeating units in the polymer.

The present invention also relates to [11] the adhesive film according to [9] or [10] wherein the polyphthalide is in a form of powder and dispersed in the adhesive.

Additionally, the present invention relates to [12] the adhesive film according to [9] or [10], said film comprises an adhesive layer and a polyphthalide thin film provided on the adhesive layer.

The present invention also relates to [13] the adhesive film according to [12], wherein the polyphthalide thin layer has at least one through hole in a part thereof.

Further, the present invention relates to [14] a method for connecting electrodes comprising:
interposing the adhesive film according to claim 9 or 10 between electrodes opposed to each other; and
applying a pressure to fix the both electrodes.

Still further, the present invention relates to [15] an electrode-connected structure, wherein polyphthalide is present between electrodes opposed to each other and the both electrodes are fixed by pressure.

The present, invention also relates to [16] the electrode-connected structure according to [15], wherein the both electrodes are fixed by an adhesive.

The present invention also relates to [17] the electrode-connected structure according to [16], wherein the both electrodes are fixed by an adhesive present in the adhesive film comprising an adhesive and polyphthalide.

The present invention relates to [18] the electrode-connected structure according to [15], wherein the both electrodes are fixed by a mechanical means.

DESCRIPTION FOR SYMBOLS

Figure 1:
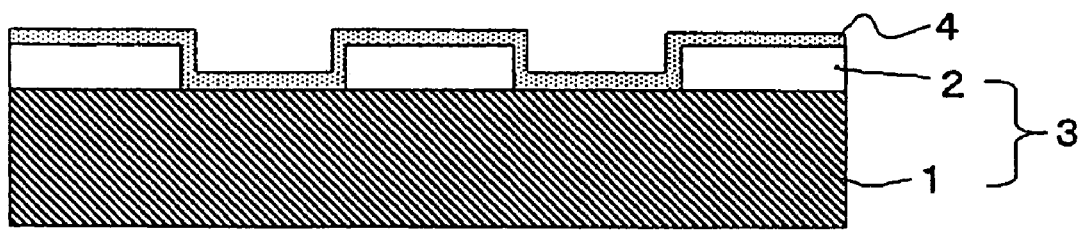
FIG. 1 is a cross-sectional view of one embodiment of the surface-treated wiring board of the present invention.

1 and 1': a substrate
2 and 2': an electrode
3: a wiring board
4: polyphthalide
5: a fixing apparatus
6: an adhesive
7 and 7': an adhesive (an adhesive layer)
8: polyphthalide (a polyphthalide thin layer)
9: a through hole

BEST MODE FOR CARRYING OUT THE INVENTION

The pressure-sensitive conductive polymer used in the present invention is a resin which is generally an insulator and changes into a conductor when a pressure is applied. As the pressure-sensitive conductive polymer, specifically, polyphthalide of formula (I) is preferred.

Polyphthalide represented by formula (I) (hereinafter, referred to as "polyphthalide") has features such that electrical resistance thereof significantly changes when a pressure is applied in the thickness direction of the polyphthalide, exhibiting electric conductivity (pressure-sensitive electric conductivity). With a relatively low pressure, the polyphthalide can exhibits changes in the order of $10^6$ or more in electrical resistance in a pressure-applied direction, as measured before and after application of the pressure. (Generally, polyphthalide has an insulating property under atmospheric pressure, while it exhibits electric conductivity under pressure.)

The wording "changes in the order of $10^6$ or more in electrical resistance" means that the electrical resistance (or electric current) measured under condition where a predetermined voltage is applied, changes in the order of $10^6$ or more, before and after application of the pressure. More specifically, it means that application of a pressure changes an electric current under a predetermined voltage in the order of $10^{-12}$ A (insulator) to an electric current in the order of $10^{-6}$ A or higher (conductor).

Polyphthalide of formula (I) used in the present invention will be described below in more detail.

As R (divalent aromatic hydrocarbon groups or heteroring-containing divalent aromatic groups) in the formula (I), there can be mentioned the following groups.

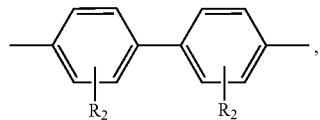

-continued

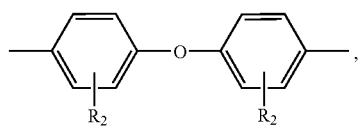

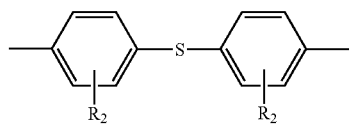

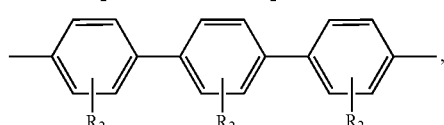

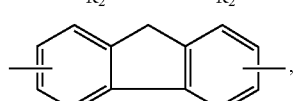

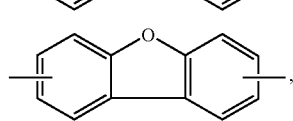

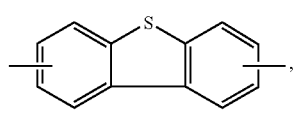

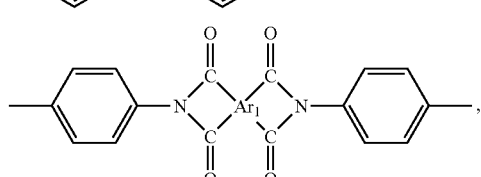

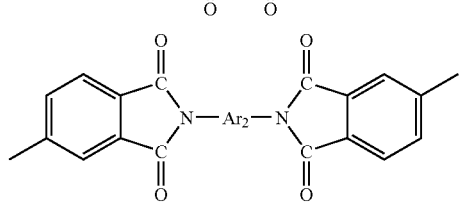

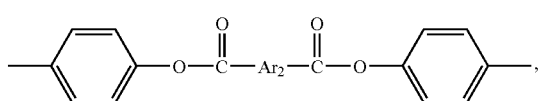

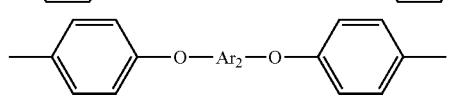

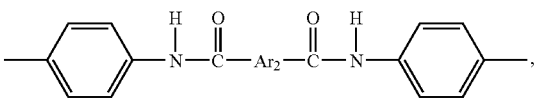

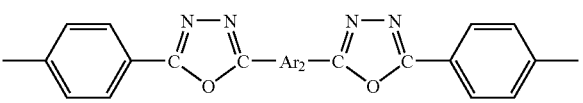

Definition for $R_2$ is the same as that for $R_1$ as mentioned above, and may be hydrogen, an alkyl group, a fluorinated alkyl group, an alkoxy group, or a halogen (such as fluorine or chlorine), and there may exist a plurality of (2 to 4) these groups.

Examples of Ar$_1$ include the following groups.

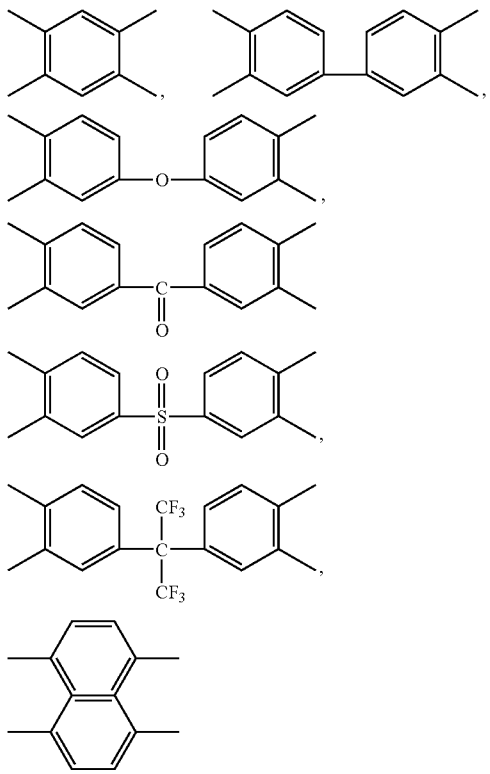

Examples of Ar$_2$ include the following groups.

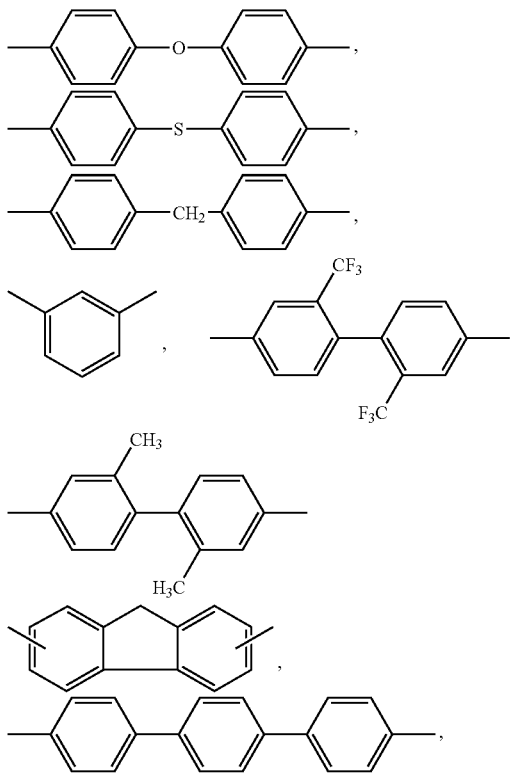

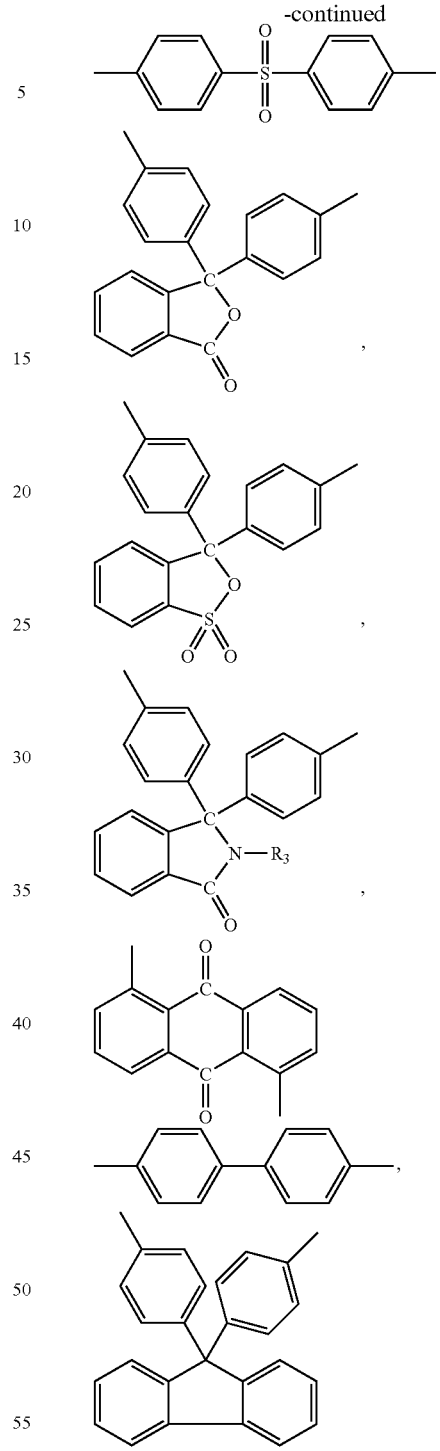

In formula (I), n representing the number of repeating units in the polymer is preferably in the range of from 50 to 300, further preferably in the range of from 70 to 200. When n is less than 50, the resultant polymer film may have disadvantageously low film strength. On the other hand, when n exceeds 300, the polymer may disadvantageously have poor solubility.

The polyphthalide may be in any form of a homopolymer, a copolymer, or a blended polymer thereof.

A phenolic resin having a phthalide ring or an epoxy resin having a phthalide ring can be added to the polyphthalide.

As the phenolic resin having a phthalide ring, a resin obtained by reacting phenolphthalein, Phenol Red, o-cresolphthalein, thymolphthalein, or Cresol Red with formaldehyde, wherein the resin is generally made into a co-oligomer (product) by addition of phenol or cresol during the reaction, can be used.

As the epoxy resin having a phthalide ring, a resin obtained by reacting a phenolic compound having a phthalide ring (or a sulfophthalide ring) represented by the formula (I) with epichlorohydrin can be used.

The phenolic resin having a phthalide ring or the epoxy resin having a phthalide ring can be used in an amount not exceeding 50% by weight. When the resin is used in an amount exceeding 50% by weight, the film after shaping is likely to be brittle. Incidentally, "% by weight" means a percentage calculated when a nonvolatile content after removing the solvent is taken as 100.

It has recently been found that polyphthalide represented by formula (I) (hereinafter, referred to as "polyphthalide") has a feature such that electrical resistance thereof significantly changes when a pressure is applied in the thickness direction of the polyphthalide when the thickness is about 10 nm to 50,000 nm, so that the polyphthalide exhibits electric conductivity. In this case, the pressure applied to polyphthalide varies depending on the shapes of electrodes, but polyphthalide has a feature to change its resistance by being applied a pressure as relatively low as 4.9 kPa (0.05 kg/cm$^2$), from a value in the order of $10^{14}\Omega$ to a value in the order of about $10^2\Omega$.

Further, a phenolic resin having a phthalide ring, an epoxy resin having a phthalide ring, and a silane-coupling agent can be added to the polyphthalide represented by formula (I).

Hereinafter, the present invention will be described with reference to the drawings.

The surface-treated wiring board of the present invention, comprising a substrate and at least one electrode, whose surface has an insulating part and an electrode part, wherein polyphthalide is formed on at least part of the surface of the electrode part, and the electrodes-connected structure using the above wiring board are described with reference to FIGS. 1 to 7.

FIG. 1 is a cross-sectional view of a surface-treated wiring board of the present invention, which comprises a wiring board 3 comprising a substrate 1 and electrodes 2, and polyphthalide 4, which is formed on the surface of the wiring board 3. It is preferred that the polyphthalide 4 has a thickness of about 10 nm (0.01 μm) to 50,000 nm (50 μm). When the thickness of the polyphthalide 4 is less than 10 nm, the anti-corrosion effect may be insufficient. On the other hand, when the thickness of the polyphthalide 4 exceeds 50,000 nm, electric conductivity thereof may become insufficient. Therefore, it is more preferred that the polyphthalide 4 has a thickness of 30 to 40,000 nm, further preferably 50 to 30,000 nm, especially preferably 100 to 2,000 nm.

Figure 2:
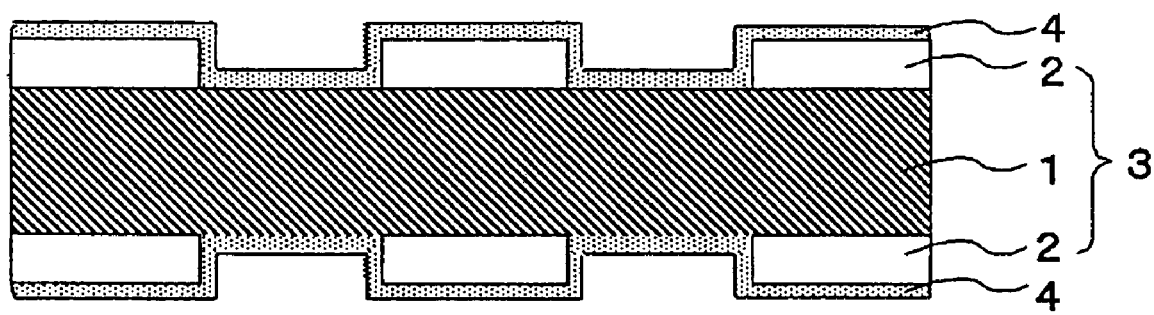
FIG. 2 is a cross-sectional view of one embodiment of the surface-treated wiring board of the present invention.
Figure 3:
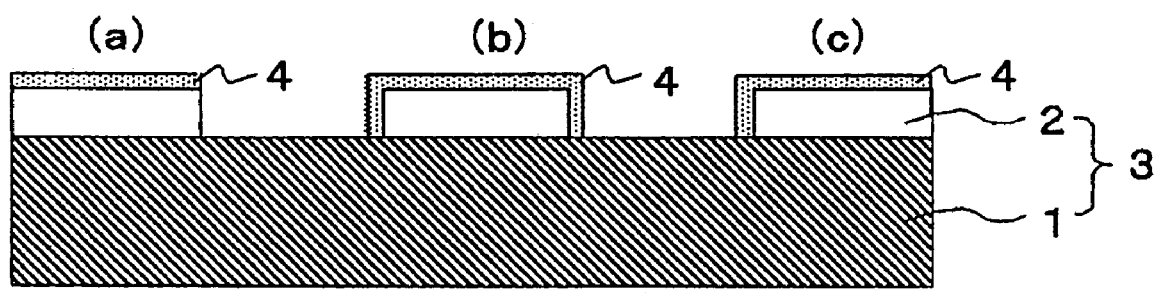
FIG. 3 is a cross-sectional view of one embodiment of the surface-treated wiring board of the present invention.

The polyphthalide 4 of the surface-treated wiring board can be provided on both front and back surfaces (see FIG. 2) of a double-sided wiring board or a multilayer wiring board. It is preferred that the polyphthalide 4 is formed on the entire surface of a wiring board having an insulating part and an electrode part (see FIGS. 1 and 2) since a dipping method can be easily employed for forming the polyphthalide 4, On the contrary, the polyphthalide 4 may be formed only on the electrode part as shown in FIG. 3. FIG. 3(a) shows an example in which the polyphthalide 4 is formed only on the front surface of the electrode, FIG. 3(b) shows an example in which the polyphthalide 4 is formed on the front surface and both sides of the electrode, and FIG. 3(c) shows an example in which the polyphthalide 4 is formed on the front surface and one side of the electrode. For connecting the electrodes the polyphthalide 4 may be formed only on the front surface of the electrode, as shown in FIG. 3(a), however, from the viewpoint of preventing corrosion, it is preferred that the entire surface of the electrode is coated with the polyphthalide 4 as shown in FIG. 3(b). In addition, when the entire surface of the electrode is coated with the polyphthalide 4 having excellent insulating property ($10^{14}\Omega\cdot$cm or higher) and excellent heat resistance (400° C. or more), ion migration between the electrodes can be prevented.

As a method for forming the polyphthalide 4, various methods, such a dipping method, a spin coating method, a printing method, and a spraying method, can be used.

Figure 4:
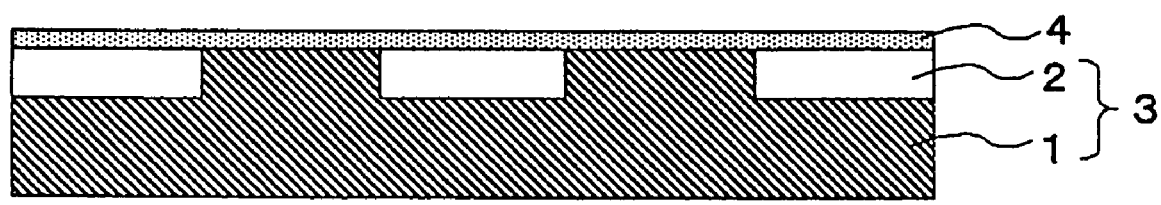
FIG. 4 is a cross-sectional view of one embodiment of the surface-treated wiring board of the present invention.

The substrate 1 may comprise a plastic film, such as polyimide or polyester, a composite of, e.g., glass and epoxy, a semiconductor such as silicon, or an inorganic substance such as glass or ceramic, and has electrode 2, optionally using an adhesive (not shown in the figures). The electrode 2 may comprise Cu, Au, Al, solder, Cr, Ni, Ag, Mo, Ta, Sn, indium tin oxide (ITO), a conductive ink, or a compound or mixture comprised mainly of these, or may have a multiplayer structure. The electrode 2 may project from the substrate 1 as shown in FIGS. 1 and 2, or may be a recessed shape or flat shape electrode as shown in FIG. 4.

Figure 5:
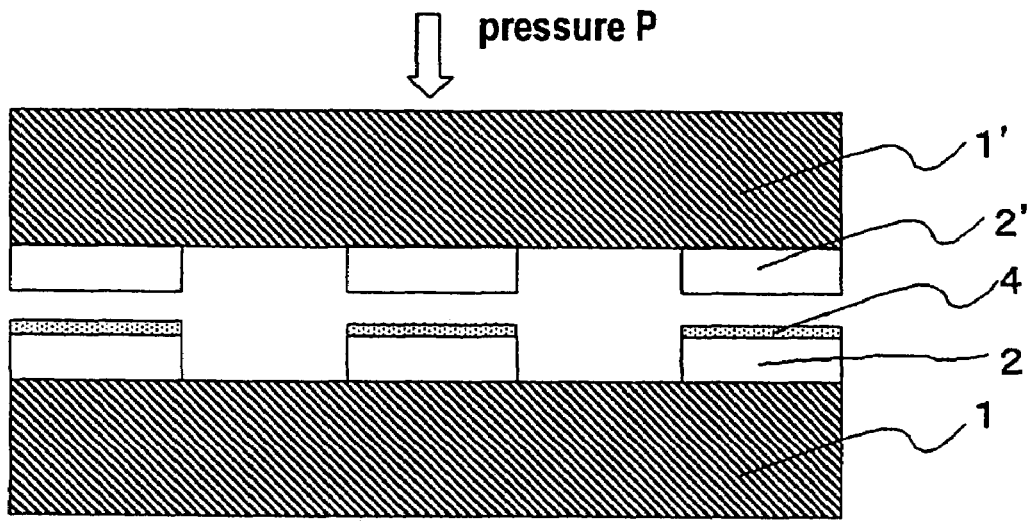
FIG. 5 is a cross-sectional view showing one embodiment of the method for connecting electrodes of the present invention.

In the method for connecting electrodes of the present invention, as shown in FIG. 5, the surface-treated wiring board having polyphthalide 4 formed thereon is disposed so that electrode 2 face electrodes 2' of another electronic part, and both electrodes are fixed to each other under pressure P. In this case, when at least one of the electrodes opposed to each other protrudes from the substrate, an electric current can flow only through the portion under pressure. Even when the electrode is present with a flat shape or recessed shape without projecting from the substrate, or when a dummy electrode having no electric conductivity is present, an electrical connection can be made only between the pressurized parts of the electrode.

By fixing these electrodes under pressure, the electrodes can be electrically connected. As a method of fixing, if a mechanical means is employed, including a fixing apparatus 5 shown in FIG. 6, such as a cramp, a screw, or a caulk, temporal connection can be attained and the electrodes can be easily separated from each other afterward. Alternatively, an adhesive 6 can be employed as the above mentioned fixing means, whereby long-term connection can be obtain. In the method of using the adhesive, it is advantageous in that the pressuring operation and the fixing operation through an adhesive can be done simultaneously to simplify the process for connection.

Figure 6:
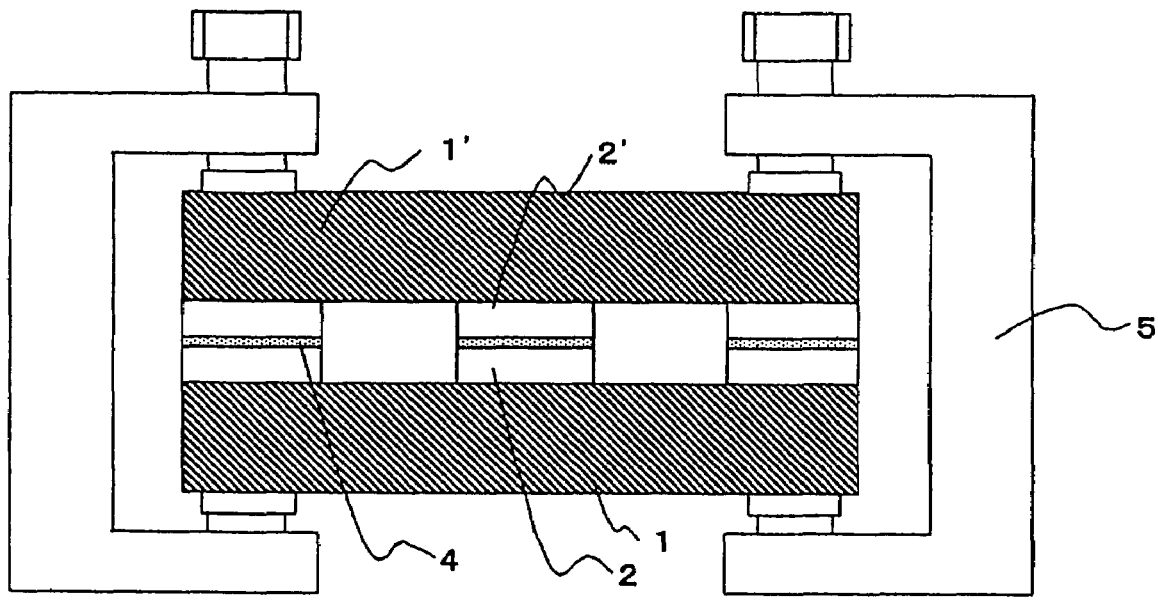
FIG. 6 is a cross-sectional view of one embodiment of the electrode-connected structure of the present invention.
Figure 7:
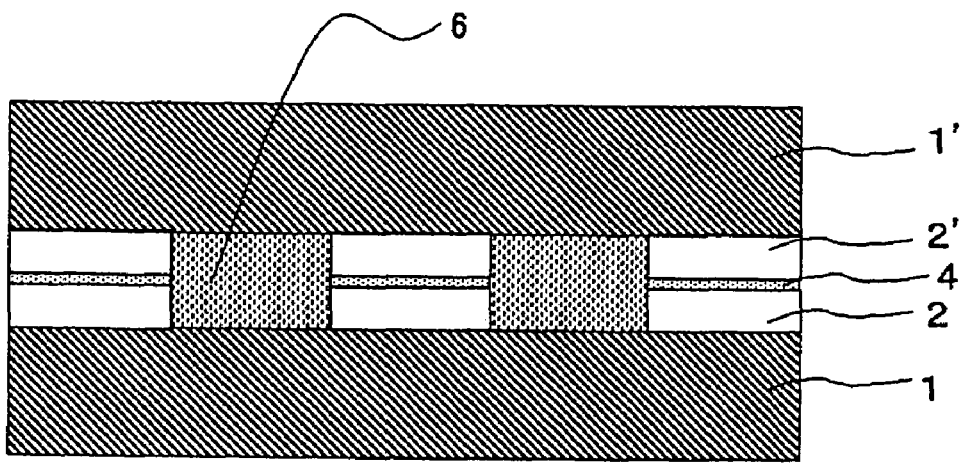
FIG. 7 is a cross-sectional view of one embodiment of the electrode-connected structure of the present invention.

As mentioned above, by using the surface-treated wiring board of the present invention, the electrodes-connected structure as shown in each of FIGS. 5 to 7, in which polyphthalide is present between the electrodes opposed each other and the electrodes are fixed, can be extremely easily obtained. In each of FIGS. 5 to 7, both the electrodes opposed to each other protrude from the substrate, however, the combination of shapes of the electrodes opposed to each other is arbitrary as long as at least one of the electrodes opposed to each other has a projecting shape, for example, a combination of a projecting electrode and a flat electrode, or a combination of a projecting electrode and a recessed electrode can be selected. In this case, polyphthalide may be present between the electrodes opposed to each other, and it may be formed either on one wiring board or on both wiring boards.

In the wiring board of the present invention having polyphthalide formed on the electrode surface, it exhibits electric conductivity in the thickness direction when a pressured is applied in the thickness direction. Therefore, electrical connection can be made only between the pressurized parts of the electrodes, and hence, it is extremely useful for connecting micro-circuits with an increased density and a higher precision. With this method, a multi-chip package having a great number of electronic parts arranged on one wiring board can be extremely easily obtained.

By virtue of having polyphthalide formed on the electrode surface, an effect of preventing corrosion or rusting of the electrodes on the substrate can be attained. In addition, the polyphthalide prevents an ion migration. Further, the wiring board having polyphthalide formed on the electrode surface can be used as they are for connecting the electrodes of another electronic part and the wiring board, therefore, a conventionally required operation for removing a surface treatment agent is not necessary, which makes the process more effective.

Further, the polyphthalide formed on the electrode surface can absorbs the difference among the heights of the electrodes, there by realizing excellent connection.

Next, an adhesive film comprising an adhesive and polyphthalide of the present invention and an electrodes-connected structure using the adhesive film are described with reference to FIGS. 8 to 15.

Figure 8:
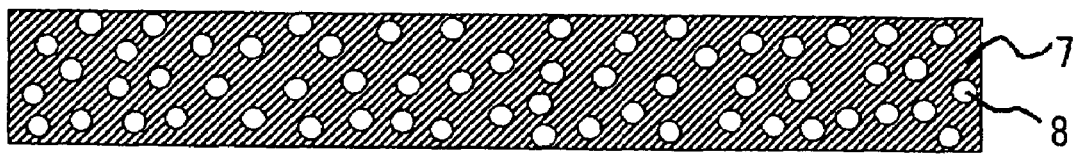
FIG. 8 is a cross-sectional view of one embodiment of the adhesive film of the present invention.

FIG. 8 is a cross-sectional view of an adhesive film comprising an adhesive 7 and polyphthalide 8.

As the adhesive 7, general adhesives for electronic parts including thermoplastic adhesives can be used, and, in view of attaining excellent heat resistance and excellent moisture resistance after connection, preferred are reactive adhesives being capable of curing by heating or light irradiation. Among the reactive adhesives, epoxy adhesives can be advantageously used since they have features such that they can be cured in a short time and hence the operability for bonding is excellent, and the adhesion properties are excellent due to their molecular structures. Further, a system in which the acrylic reactive adhesive is radically cured is also preferred since it exhibits excellent properties similar to those obtained by the epoxy adhesives. In view of achieving both excellent storing property and rapid-curing reaction, it is preferred that the curing agent is a latent curing agent.

Figure 12:
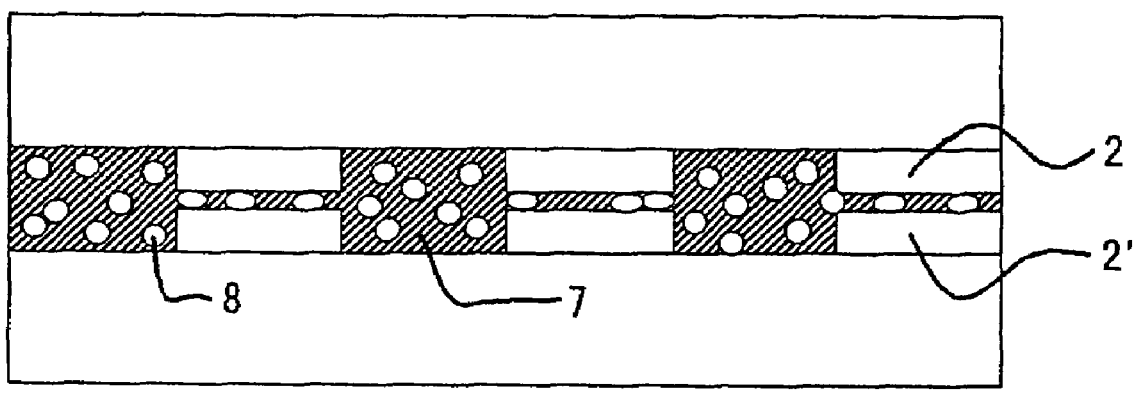
FIG. 12 is a cross-sectional view of one embodiment of the electrode-connected structure of the present invention.

The adhesive film as shown in FIG. 8 can be relatively easily obtained by a method in which powdery polyphthalide is dispersed in an adhesive, optionally using a solvent, and shaped into a film form using, for example, a roll coater, and dried to remove volatile contents. In case of connecting electronic parts each having projecting electrodes 2 formed on substrate 1 as shown in FIG. 12, the number of the powdery polyphthalide 8 dispersed in the adhesive film can be arbitrarily designed depending on the density of electrodes 2, and also, connection can be made merely by disposing the adhesive film between the electrodes, irrespective of the positions of electrodes 2. The projecting electrodes 2 may be an electronic part itself including a semiconductor chip and a wiring board, which are required to be electrically connected.

The polyphthalide 8 can be used in either a powder form or a paste form obtained by mixing and dispersing a solution of the polyphthalide in an adhesive, however, it is preferably used in a film form as shown in FIGS. 8 to 11, since the film is a continuous material having a constant thickness, whereby the process can be made automatic.

Figure 9:
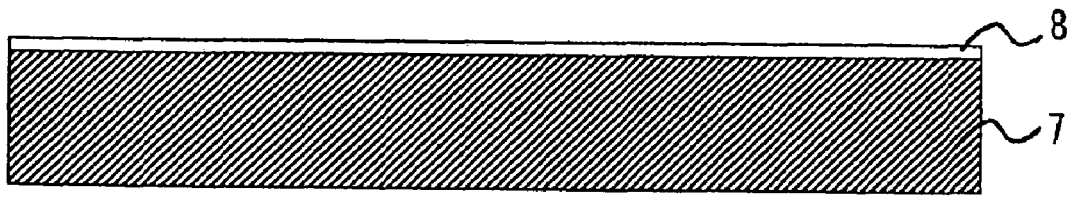
FIG. 9 is a cross-sectional view of one embodiment of the adhesive film of the present invention.
Figure 10:
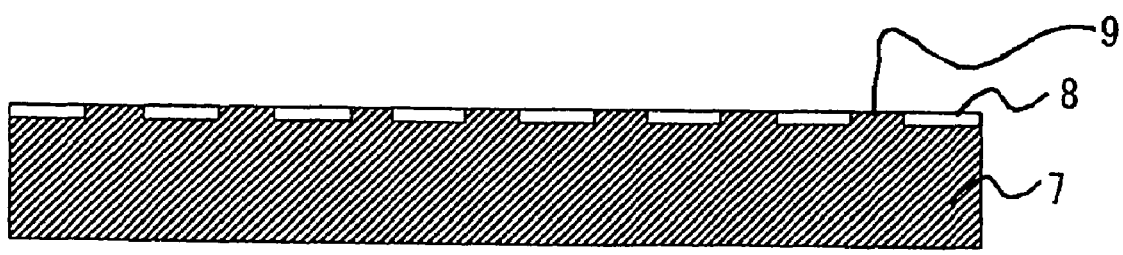
FIG. 10 is a cross-sectional view of one embodiment of the adhesive film of the present invention.
Figure 11:
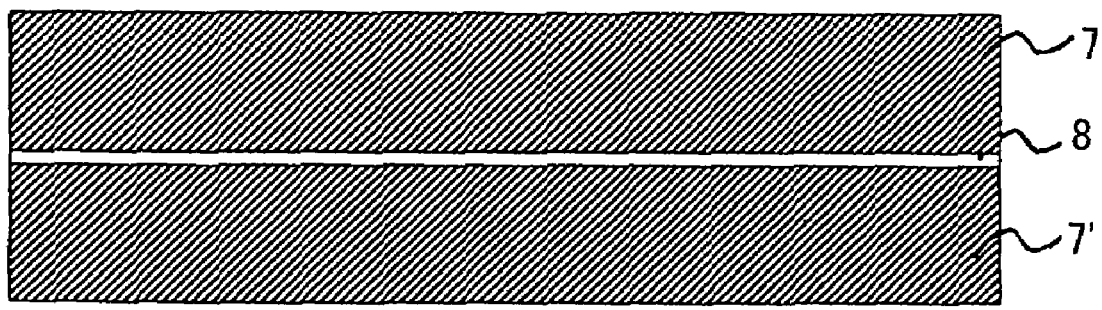
FIG. 11 is a cross-sectional view of one embodiment of the adhesive film of the present invention.

As shown in FIGS. 9 to 11, the polyphthalide 8 can be made into a thin layer, which is then provided onto an adhesive layer to make a laminated composite film. The composite film shown in each of FIGS. 9 and 10 may be prepared by a method in which a polyphthalide solution is applied onto a surface of an adhesive layer and dried to remove the solvent, or a method in which an adhesive layer and a polyphthalide thin layer are individually formed and then they are laminated. Alternatively, the composite film may be prepared by a method in which polyphthalide in the form of powder or solution is sprayed together with a gas under a high pressure. Still further, the composite film may be prepared by a method in which a polyphthalide thin layer is formed on a substrate film such as a separator, which is optionally used, and an adhesive layer is formed on the polyphthalide thin layer.

It is preferred that the polyphthalide 8 has a thickness or a particle diameter of about 10 to 50,000 nm. When the thickness or particle diameter of the polyphthalide 8 is less than 10 nm, the electric conduction may not be sufficiently effective on the other hand, when the thickness or particle diameter of the polyphthalide 8 exceeds 50,000 nm, electric conductivity may not be sufficient. Therefore, the polyphthalide 8 more preferably has a thickness or a particle diameter of 30 to 40,000 nm, further preferably 50 to 30,000 nm, especially preferably 100 to 2,000 nm.

Figure 13:
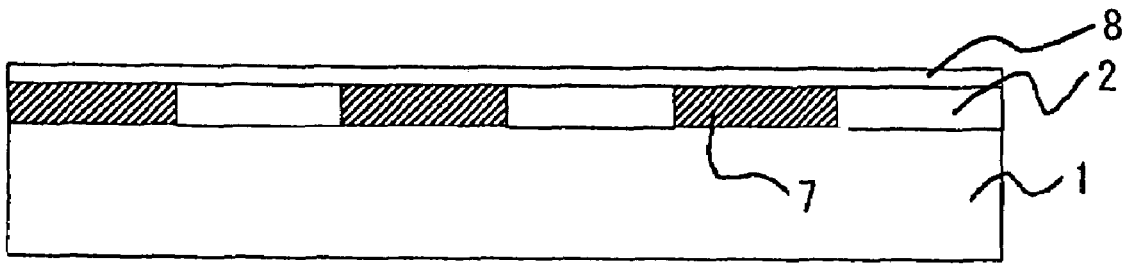
FIG. 13 is a cross-sectional view of one embodiment of the electrode-connected structure of the present invention.

The adhesive film having a structure shown in FIG. 9, in which a polyphthalide thin layer 8 is formed only on one surface of an adhesive layer 7, can be relatively easily produced, and when the electrodes 2 to be connected are in a projecting shape as shown in FIG. 13, connection can be made by disposing the adhesive film on the wiring board so that the adhesive layer 7 faces the side of the projecting electrodes. Although it is not shown in the figure, another electrode may be disposed on the surface of the polyphthalide thin layer 8. In this case, when the electrode is fixed using a mechanical means such as a cramp, the wiring board can be repeatedly used, for example, for an examination purpose. In addition, this example is especially useful for connection of a great number of electronic parts having different sizes and heights arranged on the same surface, for example, multi-chip module (MCM).

Figure 14:
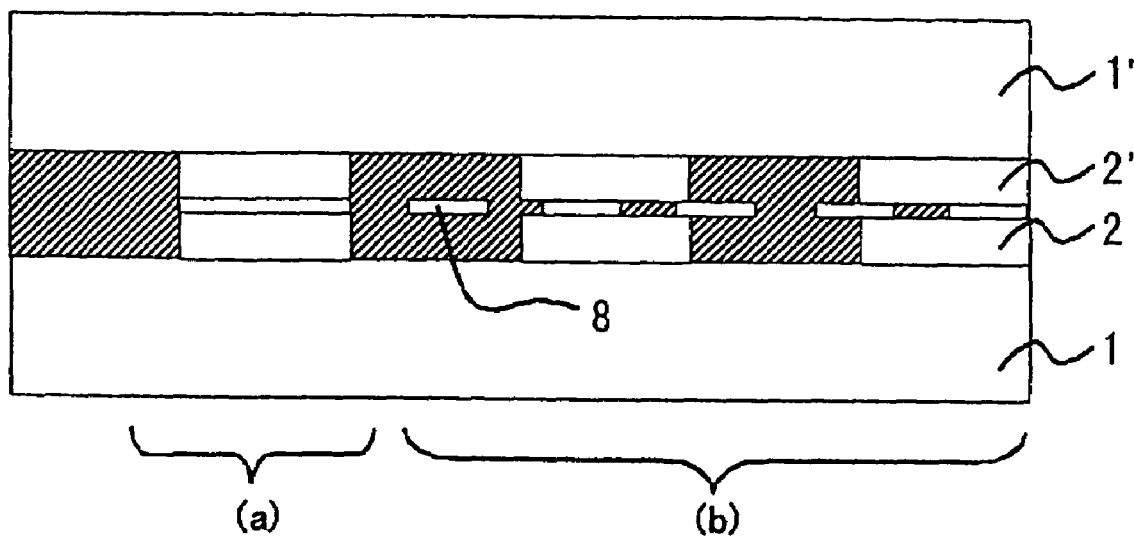
FIG. 14 is a cross-sectional view of one embodiment of the electrode-connected structure of the present invention.

FIG. 10 shows an example in which a through hole 9 is formed in a part of the polyphthalide thin layer 8 shown in FIG. 9 and the part is filled with the adhesive 7. In this example, as shown in FIG. 14, the adhesive flows beyond the polyphthalide thin layer 8 to the side of a substrate 1', with heating and pressurizing process for connection, so that the surface of the substrate, 1' is also bonded by the adhesive. In other words, electrical and mechanical connection having excellent reliability between the electronic parts facing each other can be achieved. In this case, the through hole 9 may be formed so as to correspond to the pitch of the electrodes as shown in FIG. 14(*a*). Alternatively, the through hole 9 may be arbitrarily formed, irrespective of the pitch of the electrodes, as shown in FIG. 14(*b*). It is preferred that the through hole 9 is arbitrarily formed since the operation for connection can be carried out, irrespective of the positions of the electrodes.

Figure 15:
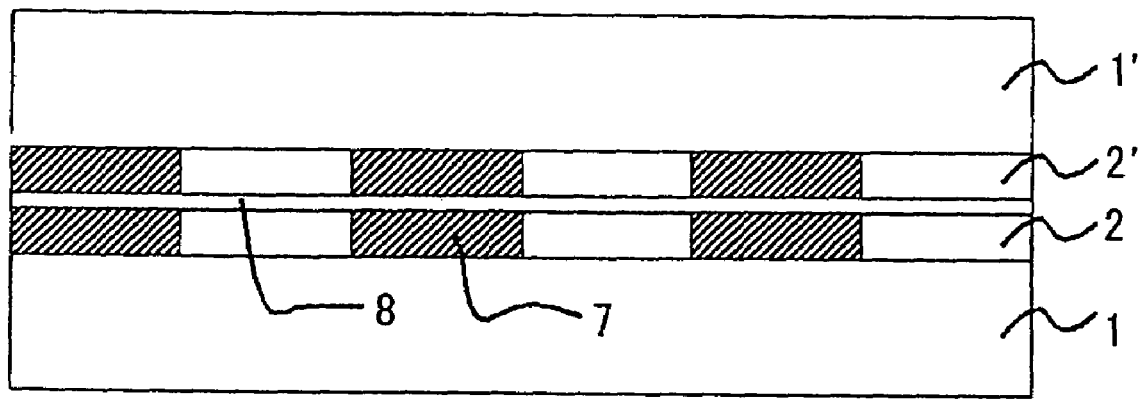
FIG. 15 is a cross-sectional view of one embodiment of the electrode-connected structure of the present invention.

FIG. 11 shows a structure in which a polyphthalide thin layer 8 is sandwiched between adhesive layers 7 and 7', that is, both surfaces of the polyphthalide thin layer 8 are covered with the adhesive layers 7 and 7'. Thickness of each of the adhesive layers 7 and 7' may appropriately designed, based on the thickness with which the electrodes are covered with the adhesive after connection and the space between the electrodes can be filled with the adhesive, and depending on the heights of the electrodes used. In this case, the polyphthalide thin layer 8 is covered with the adhesive, and therefore, removal of the polyphthalide thin layer is unlikely to occur, and thus, it is preferably used when both of the electrodes to be connected are of a projecting shape. When the adhesive film having this structure is used for connecting electronic parts having, respectively, projecting electrodes 2 and 2' formed on substrates 1 and 1', respectively, as shown in FIG. 15, the substrates can be connected intermediated by the polyphthalide thin layer 8 between the electrodes 2 and 2'. Although it is not shown in FIGS. 11 and 15, when a though hole is formed in a part of a polyphthalide thin layer and filled with an adhesive 7 as shown in FIG. 10, an influence due to uneven heights of the electrodes can be advantageously avoided.

As mentioned above, by using the adhesive film comprising an adhesive and polyphthalide of the present invention, the electrodes-connected structure shown in each of FIGS. 12 to 15, in which polyphthalide is present between the electrodes opposed to each other and the electrodes are fixed, can be easily obtained.

In each of FIGS. 12 to 15, both of the electrodes opposed to each other are projecting from the substrate, however, the combination of shapes is arbitrary as long as at least one of the electrodes has a projecting shape, for example, a combination of a projecting electrode and a flat electrode, or a combination of a projecting electrode and a recessed electrode can be chosen. In this case, the polyphthalide may be present between the electrodes, and the adhesive maintains the connection between the electrodes and bonds the substrates together, resulting in long-term connection reliability.

In the adhesive film comprising an adhesive and polyphthalide of the present invention, by applying a pressure to the polyphthalide in the thickness direction, the polyphthalide exhibits electric conductivity in the thickness direction. Therefore, an electrical connection can be made only between the pressurized parts of the electrode, and hence, the adhesive film is advantageously used for connection of electrodes having a high density. In this case, the adhesive in the adhesive film can mechanically fix electronic parts or electrodes under pressure, in other words, both electrical connection and mechanical connection can be attained simultaneously by the same operation, and therefore the adhesive film is extremely useful for connecting micro-circuits. The adhesive flows under pressure and therefore fills the spaces between the uneven surfaces of the connected part, so that an effect of the adhesive as a sealant, e.g., a moisture-preventing effect or a stain-preventing effect can be expected. That is, by using the adhesive film comprising an adhesive and polyphthalide of the present invention, both electrical connection by an applied pressure and fixing by an adhesive can be attained simultaneously by the same operation, thus rendering the process for connection extremely easy.

As the adhesive to be used in the present invention, a thermosetting adhesive, a radically curing adhesive, a photo-curing adhesive, or a thermoplastic (hot-melt) adhesive can be used.

The thermosetting adhesive may include an epoxy resin and a latent curing agent, and, when it is used in the form of film adhesive, it preferably contains a film-forming material. As the epoxy resin, bisphenol epoxy resins derived from epichlorohydrin and bisphenol A, bisphenol F, bisphenol AD, or bisphenol S, epoxy novolak resins derived from epichlorohydrin and phenolic novolak or cresol novolak, naphthalene epoxy resins having a skeleton containing a naphthalene ring, and various epoxy compounds having two or more glycidyl groups per molecule, such as glycidylamine, glycidyl ether, biphenyl, or an alicycle compound, can be used individually or in combination of two or more kinds. In view of preventing electro-migration, it is, preferred that the epoxy resin is of a high-purity product with a reduced impurity ion (e.g. $Na^+$, $Cl^-$) content or a reduced hydrolyzable chlorine content of 300 ppm or less.

Examples of the latent curing agents include imidazole, hydrazide, amineimide, and dicyandiamide latent curing agents. These can be used individually or in combination of two or more kinds, and a decomposition promoter or inhibitor may be mixed into the latent curing agent. Further, in view of prolonging a usable time of the adhesive, those in a micro-capsule form prepared by coating these latent curing agents with a polymer material, such as polyurethane or polyester. For obtaining a sufficient reaction rate, the amount of the latent curing agent to be added is preferably 0.1 to 60 parts by weight, more preferably 1 to 20 parts by weight, based on 100 parts by weight of the sum of the film-forming material and the epoxy resin. When the amount of the late t curing agent added is less than 0.1 part by weight, a sufficient reaction rate is not likely to be attained, thus making it difficult to obtain a high adhesion strength and a small contact resistance. On the other hand, when the amount of the latent curing agent added exceeds 60 parts by weight, the fluidity of the adhesive is likely to be lowered, the contact resistance tends to increase, or the pot life of the adhesive tends to be shorter.

The film-forming material solidifies a liquid substance, and when a composition containing the film-forming material is formed into a film, the film-forming material facilitates handling of the film and imparts mechanical properties to the film so that the film is not easily torn or cracked or it does not have tackiness, and the resultant film can be handled in a normal situation.

Examples of film-forming materials include phenoxy resins, polyvinyl formal resins, polystyrene resins, polyvinyl butyral resins, polyester resins, polyamide resins, xylene resins, and polyurethane resins of these film-forming materials, preferred are phenoxy resins having excellent adhesion properties, excellent compatibility, excellent heat resistance, and excellent mechanical strength. The phenoxy resin is a resin obtained by reacting a difunctional phenol with an epihalohydrin until the product has a high molecular weight or subjecting a difunctional epoxy resin and a difunctional. phenol to polyaddition. Specifically, the phenoxy resin can be obtained by reacting 1 mol of a difunctional phenol with 0.985 to 1.015 mol of an epihalohydrin in a non-reactive solvent in the presence of an alkali metal hydroxide at a temperature of 40 to 120° C.

In view of mechanical properties and thermal properties, especially preferred are phenoxy resins obtained by subjecting to polyaddition at 50 to 200° C. a difunctional epoxy resin and a difunctional phenol in an {epoxy group:phenolic hydroxyl group} equivalent ratio of 1:0.9 to 1:1.1 in an organic solvent having a boiling point of 120° C. or higher such as an amide, ether, ketone, lactone, or alcohol solvent, in the presence of a catalyst such as an alkali metal compound, an organophosphorus compound, or a cyclic amine compound, so that the solids content of the reaction system becomes 50 parts by weight or less. Examples of the difunctional epoxy resins include bisphenol A epoxy resins, bisphenol F epoxy resins, bisphenol AD epoxy resins, and bisphenol S epoxy resins. The difunctional phenol is a compound having two phenolic hydroxyl groups, and examples include hydroquinones, and bisphenols such as bisphenol A, bisphenol F, bisphenol AD and bisphenol S. The phenoxy resin may be modified by a radically polymerizable functional group, an epoxy group, or a carboxyl group, and, in such a case, the resin is improved in heat resistance In addition, the phenoxy resin may have in its molecule a molecular structure derived from a polycyclic aromatic compound. Examples of the polycyclic aromatic compounds include dihydroxy compounds of naphthalene, biphenyl, acenaphthene, fluorene, dibenzofuran, anthracene, and phenanthrene, and especially preferred is 9,9,'-bis(4-hydroxyphenyl)fluorene.

The amount of the film forming material to be added may be 2 to 80% by weight, preferably 5 to 70% by weight, especially preferably 10 to 60% by weight. When the amount is less than 2% by weight, the stress relaxation and the adhesive strength may be insufficient. On the other hand, when the amount exceeds 80% by weight, the fluidity of the adhesive may be lowered. The film-forming material is required when the adhesive is formed into a film, but it is not required when the adhesive is used in the form of varnish or paste.

The radically curing adhesive comprises a radically polymerizable compound and a polymerization initiator, and, when the adhesive is formed into a film, it is preferred that, the radically curing adhesive further contains a film-forming material.

The radically polymerizable compound is a compound having a functional group which is radically polymerized, and examples include (meth)acrylate, maleimide, citraconimide, and nadimide, and two or more kinds may be used in combination of two or more kinds. The radically polymerizable compound can be used in either form of monomer and oligomer, and may be a mixture of monomers and oligomers.

Examples of (meth)acrylate include methyl(meth)acrylate, ethyl(meth)acrylate, isopropyl(meth)acrylate, isobutyl (meth)acrylate, ethylene glycol di(meth)acrylate, diethylene glycol di(meth)acrylate, trimethylolpropane tri(meth)acrylate, tetramethylene glycol tetra(meth)acrylate, 2-hydroxy-1,3-diacryloxypropane, 2,2-bis[4-(acryloxymethoxy)phenyl] propane, 2,2-bis[4-(acryloxyethoxy)phenyl]propane, dicyclopentenyl (meth)acrylate, tricyclodecanyl(meth)acrylate, tris(acryloxyethyl)isocyanurate, urethane(meth)acrylate, and isocyanuric acid ethylene oxide-modified diacrylate, and these may be used individually or in combination of two or more kinds. If desired, a radical polymerization inhibitor, such as hydroquinone or methyl ether hydroquinone, may be used in an amount such that the curing properties of the radically curing adhesive are not sacrificed.

When a phosphate compound is used as the radically, polymerizable compound, the radically curing adhesive is, improved in adhesive force relative to an inorganic substance, such as a metal. The amount of the phosphate compound used may be 0.1 to 10 parts by weight, preferably 0.5 to 5 parts by weight. The phosphate compound is obtained as a product of a reaction of phosphoric anhydride and 2-hydroxyethyl (meth)acrylate. Specific examples of phosphate compounds include mono(2-methacryloyloxyethyl)acid phosphate and di(2-methacryloyloxyethyl)acid phosphate, and these may be used individually or in combination of two or more kinds.

Examples of maleimide include a compound having at least one maleimide group per molecule, such as phenylmaleimide, 1-methyl-2,4-bismaleimidobenzene, N,N'-m-phenylenebismaleimide; N,N'-p-phenylenebismaleimide, N,N'-4,4-biphenylenebismaleimide, N,N'-4,4-(3,3-dimethylbiphenylene)bismaleimide, N,N'-4,4-(3,3-dimethyldiphenylmethane)bismaleimide, N,N'-4,4-(3,3-dimethyldiphenylmethane)bismaleimide, N,N'-4,4-diphenylmethanebismaleimide, N,N'-4,4-diphenylpropanebismaleimide, N,N'4,4-diphenyl ether bismaleimide N,N'-4,4-diphenylsulfonebismaleimide, 2,2-bis[4-(4-maleimidophenoxy)phenyl]propane, 2,2-bis[3-s-butyl-,3,4-(4-maleimidophenoxy)phenyl]propane, 1,1-bis[4-(4-maleimidophenoxy)phenyl]decane, 4,4'-cyclohexylidene-bis[1-(4-maleimidophenoxy)phenoxy]-2-cyclohexylbenzene, and 2,2-bis[4-(4-maleimidophenoxy)phenyl]hexafluoropropane, and these may be used individually or in combinations of two or more kinds.

Examples of citraconimide include a citraconimide compound having at least one citraconimide group per molecule, such as phenylcitraconimide, 1-methyl-2,4-biscitraconimidobenzne, N,N'-m-phenylenebiscitraconimide, N,N'-p-phenylenebiscitraconimide, N,N'-4,4-biphenylenebiscitraconimide, N,N'-4,4-(3,3-dimethylbiphenylene) biscitraconimide, N,N'-4,4-(3,3-dimethyldiphenylmethane) biscitraconimide, N,N'-4,4-(3,3-diethyldiphenylmethane) biscitraconimide, N,N'-4,4-diphenylmethanebiscitraconimide, N,N'-4,4-diphenylpropanebiscitraconimide, N,N'-4,4-diphenylether biscitraconimide, N,N'-4,4-diphenylsulfonebiscitraconimide, 2,2-bis[4-(4-citraconimidophenoxy)phenyl]propane, 2,2-bis[3-s-butyl-3,4-(4-citraconimidophenoxy)phenyl]propane, 1,1-bis[4-(4-citraconimidophenoxy)phenyl]decane, 4,4'-cyclohexylidene-bis[1-(4-citraconimidophenoxy)phenoxy]-2-cyclohexylbenzene, and 2,2-bis[4-(4-citraconimidophenoxy)phenyl]hexafluoropropane, and these may be used individually or in combination of two or more kinds.

Examples of nadimide include a nadimide compound having at least one nadimide group per molecule, such as phenylnadimide, 1-methyl-2,4-bisnadimidobenzne, N,N'-m-phenylenebisnadimide, N,N'-p-phenylenebisnadimide, N,N'-4,4-biphenylenebisnadimide, N,N'-4,4-(3,3-dimethylbiphenylene)bisnadimide, N,N'-4,4-(3,3-dimethyldiphenylmethane)bisnadimide, N,N'-4,4-(3,3-diethyldiphenylmethane)bisnadimide, N,N'-4,4-diphenylmethanebisnadimide, N,N'-4,4-diphenylpropanebisnadimide, N,N'-4,4-diphenyl ether bisnadimide, N,N'-4,4-diphenylsulfonebisnadimide, 2,2-bis[4-(4-nadimidophenoxy)phenyl]propane, 2,2-bis[3-s-butyl-3,4-(4-nadimidophenoxy)phenyl]propane, 1,1-bis[4-(4-nadimidophenoxy)phenyl]decane, 4,4'-cyclohexylidene-bis[1-(4-nadimidophenoxy)phenoxy]-2-cyclohexylbenzene, and 2,2-bis[4-(4-nadimidophenoxy)phenyl]hexafluoropropane, and these may be used individually or in combination of two or more kinds.

When the radically polymerizable compound is used, a polymerization initiator is used. With respect to the polymerization initiator, there is no particular limitation as long as it is a compound which generates radicals by irradiation with lights or by heating, and examples include peroxides and azo compounds. The polymerization initiator is appropriately selected depending on the desired bonding temperature or time and the desired storage stability, but, in view of achieving high reactivity and excellent storage stability, preferred are organic peroxides having a half-life period of 10 hours at 40° C. or higher and having a half-life period of 1 minute at 180° C. or lower, and especially preferred are organic peroxides having a half-life period of 10 hours at 50° C. or higher and having a half-life period of 1 minute at170° C. or lower. When the bonding time is 10 seconds, for obtaining a satisfactory reactivity, the amount of the polymerization initiator to be added is preferably 1 to 20% by weight, especially preferably 2 to 15% by weight. Specifically, the organic peroxide to be used can be selected from diacyl peroxides, peroxydicarbonates, peroxy esters, peroxy ketals, dialkyl peroxides, hydroperoxides, and silylperoxides, and, of these, peroxy esters, dialkyl peroxides, hydroperoxides, and silylperoxides are especially preferred since they have a chlorine ion content or organic acid content of 5,000 ppm or less and therefore generate less organic acid after decomposition, so that corrosion of the electrodes can be suppressed.

Examples of diacyl peroxides include isobutyl peroxdie, 2,4-dichlorobenzoyl peroxdie, 3,5,5-trimethylhexanoyl peroxdie, octanoyl peroxdie, lauroyl peroxdie, stearoyl peroxdie, succinic peroxdie, benzoylperoxytoluene, and benzoyl peroxdie.

Examples of peroxydicarbonates include di-n-propyl peroxydicarbonate, diisopropyl peroxydicarbonate, bis(4-t-butylcyclohexyl)peroxydicarbonate, di-2-ethoxymethoxy-peroxydicarbonate, di(2-ethylhexylperoxy)dicarbonate, dimethoxybutyl peroxydicarbonate, and di(3-methyl-3-methoxybutylperoxy) dicarbonate.

Examples of peroxy esters include cumyl peroxyneodecanoate, 1,1,3,3-tetramethylbutyl peroxyneodecanoate, 1-cyclohexyl-1-methylethyl peroxyneodecanoate, t-hexyl peroxyneodecanoate, t-butyl peroxypivalate, 1,1,3,3-tetramethylbutyl peroxy-2-ethylhexanoate, 2,5-dimethyl-2,5-di(2-ethylhexanoylperoxy)hexane, 1-cyclohexyl-1-methylethyl peroxy-2-ethylhexanoate, t-hexyl peroxy-2-ethylhexanoate, t-butyl peroxy-2-ethylhexanoate, t-butyl peroxyisobutyrate, 1,1-bis(t-butylperoxy)cyclohexane, t-hexyl peroxyisopropylmonocarbonate, t-butyl peroxy-3,5,5-trimethyl hexanoate, t-butyl peroxylaurate, 2,5-dimethyl-2,5-di(m-toluoylperoxy)hexane, t-butyl peroxyisopropylmonocarbonate, t-butyl peroxy-2-ethylhexylmonocarbonate, t-hexyl peroxybenzoate, and t-butyl peroxyacetate.

Examples of peroxy ketals include 1,1-bis(t-hexylperoxy)-3,3,5-trimethylcyclohexane, 1,1-bis(t-hexylperoxy)cyclohexane, 1,1-bis(t-butylperoxy)-3,3,5-trimethylcyclohexane, 1,1-(t-butylperoxy)cyclododecane, and 2,2-bis(t-butylperoxy)decane.

Examples of dialkyl peroxides include α,α'-bis(t-butylperoxy)diisopropylbenzene, dicumyl peroxide, 2,5-dimethyl-2,5-di(t-butylperoxy)hexane, and t-butylcumyl peroxide.

Examples of hydroperoxides include diisopropylbenzene hydroperoxide and cumene hydroperoxide.

Examples of silylperoxides include t-butyltrimethylsilylperoxide, bis(t-butyl)dimethylsilylperoxide, t-butyltrivinylsilylperoxide, bis(t-butyl)divinylsilylperoxide, tris(t-butyl)vinylsilylperoxide, t-butyltriallylsilylperoxide, bis(t-butyl)diallylsilylperoxide, and tris(t-butyl)allylsilylperoxide.

From the viewpoint of suppressing corrosion of the electrodes, it is preferred that the curing agent (polymerization initiator) has a chlorine ion content or organic acid content of 5,000 ppm or less, and further, it is more preferred that the curing agent is one which generates less organic acid after decomposition by heating. In addition, from the viewpoint of improving the stability of the adhesive prepared, it is preferred that the curing agent has a weight holding rate of 20% by weight or more 24 hours after being allowed to stand at room temperature (25° C.) under atmospheric pressure. If desired, these can be used in combination of two or more kinds.

These free-radical generating agents (polymerization initiator) can be used individually or in combination of two or more kinds, and a decomposition promoter or inhibitor may be mixed into these agents.

A microcapsule prepared by coating the above free-radical generating agent with a polymer material, such as polyurethane or polyester, can advantageously prolong the usable time of the adhesive.

The film-forming material is the same as those mentioned above.

In addition to the radically polymerizable compound, as a thermosetting resin, the above-described epoxy resin can be added. The epoxy resins may be used in combination of two or more kinds.

Examples of curing agents for the epoxy resin include curing agents generally used as curing agents for epoxy resins, such as amine, phenol, acid anhydride, imidazole, and dicyandiamide curing agents. Further, if desired, a tertiary amine or an organophosphorus compound generally used as a curing promoter may be used.

Further, as a way of carrying out the reaction of the epoxy resin, instead of the use of the curing agent, a sulfonium salt or an iodonium salt may be used to effect cationic polymerization.

It is preferred that the photo-curing adhesive contains a photo-cationically polymerizable compound and a polymerization initiator which generates cationic species mainly by irradiation with lights comprising a light having a wavelength of 180 to 750 nm or mainly by heating.

As the photo-cationically polymerizable compound, at least one compound can be selected from an epoxy compound, a vinyl ether compound, an oxetane compound, and a cyclic ether compound.

As the polymerization initiator which generates cationic species mainly by irradiation with lights comprising a light having a wavelength of 180 to 750 nm or mainly by heating, at least one compound can be selected from an aromatic sulfonium salt, an iodonium salt, an iron-arene complex, an aromatic sulfonium salt, and an aliphatic sulfonium salt.

The polymerization initiator which generates cationic species mainly by irradiation with lights comprising a light having a wavelength of 180 to 750 nm is a polymerization intiator which generates cationic species basically by irradiation with lights comprising a light having a wavelength of 180 to 750 nm, and the cationic species generated from this polymerization initiator are comprised mainly of cationic species caused by light irradiation, but they may be caused by heating, that is, the majority of the cationic species generated from this polymerization initiator is caused by light irradiation. On the other hand, the polymerization initiator which generates cationic species mainly by heating is a polymerization initiator which generates cationic species basically by heating, and the cationic species generated from this polymerization initiator are comprised mainly of cationic species caused by heating, but they may be caused by light irradiation, that is, the majority of the cationic species generated from this polymerization initiator is caused by heating. The photo-cationically polymerizable compound is a compound having a functional group which is polymerizable due to cationic species generated mainly by irradiation with lights comprising a light having a wavelength of 180 to 750 nm or due to cationic species generated mainly by heating, and examples include epoxy compounds, vinyl ether compounds, oxetane compounds, and cyclic ether compounds.

With respect to the epoxy compound, there is no particular limitation as long as it has two or more epoxy groups per molecule, and known epoxy compounds can be used. Examples to epoxy compounds include bisphenol epoxy resins derived from epichlorohydrin and bisphenol A or bisphenol F; polyglycidyl, ethers; polyglycidyl esters; aromatic epoxy compounds; alicyclic epoxy compounds; novolak epoxy compounds, such as cresol novolak epoxy resins and phenolic novolak epoxy resins; glycidylamine epoxy compounds; glycidyl ester epoxy compounds; and copolymers of biphenyl diglycidyl ether, triglycidyl isocyanurate, polyglycidyl methacrylate, or glycidyl methacrylate and copolymerizable vinyl monomers. These can be used individually or in combination of two or more kinds.

Examples of vinyl ether compounds include alkyl vinyl ether compounds, alkenyl vinyl ether compounds, alkynyl vinyl ether compounds, and arylvinyl ether compounds.

Examples of oxetane compounds include oxetane alcohols, aliphatic oxetane compounds, and aromatic oxetane compounds.

Examples of cyclic ether compounds include tetrahydrofuran compounds and tetrahydropyran compounds.

Of these, epoxy compounds are preferred because ones of a wide variety of grades having different molecular weights are available, as compared to other compounds, so that adhesion properties, reactivity, and curing properties can be arbitrarily selected.

The amount of the photo-cationically polymerizable compound added is preferably 10 to 90% by weight, more preferably 25 to 75% by weight, based on the total weight of the adhesive. When the amount of the photo-cationically polymerizable compound added is less than 10% by weight, only an adhesive forming a cured product having poor physical properties can be obtained. On the other hand, when the amount of the photo-cationically polymerizable compound added exceeds 90% by weight, wherein, for example, the photo-cationically polymerizable compound has a large cure shrinkage, it is difficult to employ a method of relaxing the cure shrinkage by using other components.

The epoxy equivalent of the epoxy compound is preferably 43 to 1,000, more preferably 50 to 800, especially preferably 73 to 600. When the epoxy equivalent of the epoxy compound is less than, 43 or exceeds 1,000, the adhesion strength is likely to be lowered upon connecting the electrodes. From the viewpoint of preventing an electromigration, it is preferred that the epoxy compound is of a high-purity product with a reduced impurity ion (e.g., $Na^+$, $Cl^-$) content or a hydrolyzable chlorine content of 300 ppm or, less.

As the polymerization initiator which generates cationic species mainly by irradiation with lights comprising a light having a wavelength of 180 to 750 nm or the polymerization initiator which generates cationic species mainly by heating, an onium salt, such as an aromatic diazonium salt, an aromatic sulfonium salt, an aliphatic sulfonium salt, an aromatic iodonium salt, a phosphonium salt, a pyridinium salt, or a selenonium salt; a complex compound, such as a metal-arene, complex or a silanol-aluminum complex; or benzoin tosylate or o-nitrobenzyl tosylate can be used. As a counter anion for forming a salt, from the viewpoint of obtaining excellent reactivity, hexafluoroantimonate, hexafluorophosphate, tetrafluoroborate, or tetrakis(pentafluorophenyl)borate is preferably used.

As the polymerization initiator which generates cationic species mainly by heating, from the viewpoint of improving the storage stability of the adhesive, preferred are compounds having a low heat catalytic activity at 100° C. or lower. Further, from the viewpoint of improving the reactivity of the adhesive, it is preferred that the polymerization initiator which generates cationic species mainly by irradiation with lights comprising a light having a wavelength of 180 to 750 nm has a heat activity equivalent to that of the polymerization initiator which generates cationic species mainly by heating, or, conversely, the polymerization initiator which generates cationic species mainly by heating has a photo-activity equivalent to that of the polymerization initiator which generates cationic species mainly by irradiation with lights comprising a light having a wavelength of 180 to 750 nm.

As the polymerization initiator which generates cationic species mainly by irradiation with lights comprising a light having a wavelength of 180 to 750 nm, preferred are compounds having at least one aromatic ring in their molecule, for example, aromatic sulfonium salts, such as bis[4-(diphenylsulfonio)-phenyl]sulfide-bis-hexafluorophosphate, bis[4-di{4-(2-hydroxyethyl)phenyl}sulfonio-phenyl]sulfidebis-hexafluorophosphate, and bis[4-di{4-(2-hydroxyethyl)phenyl}sulfonio-phenyl]sulfidebis-hexafluoroantimonate; η-5,2,4-(cyclopentadienyl)[(1,2,3,4,5,6-η)-(methylethyl)-benzene]-iron (II)hexafluorophosphate; (tolylcumyl)iodonium tetrakis(pentafluoropenyl)borate; diallyliodonium hexafluoroantimonate; and mixtures thereof can be used. Further, commercially available compounds, such as ADEKA Optomer SP-150, ADEKA Optomer SP-170 (trade names; manufactured by Asahi Denka Kogyo K.K.), CYRACURE UVI-6990 (trade name; manufactured by Union Carbide Corporation), SAN-AID SI-60L, SAN-AID SI-80L, SAN-AID SI-100L, (trade names; manufactured by SANSHIN CHEMICAL INDUSTRY, CO., LTD.), Irgacure 261 (trade name; manufactured by Ciba Specialty Chemicals K.K.), and RHODORSIL PHOTOINITIATOR 2074 (trade name; manufactured by Rhodia Japan), and solutions thereof can be used.

As the polymerization initiator which generates cationic species mainly by heating, compounds, such as aromatic sulfonium salts; aliphatic sulfonium salts, and dialkylphenacylsulfonium salts, can be preferably used, and commercially available compounds, such as SAN-AID SI-60L, SAN-AID SI-80L, SAN-AID-SI-100L, (trade names; manufactured by SANSHIN CHEMICAL INDUSTRY, CO., LTD.), ADEKA Opton CP-66, ADEKA Opton CP-77 (trade names; manufactured by Asahi Denka Kogyo K.K.), and CI-2624 (trade name; manufactured by NIPPON SODA CO., LTD.), and solutions thereof can be used.

When the polymerization initiator which generates cationic species mainly by irradiation with lights comprising a light having a wavelength of 180 to 750 nm or the polymerization initiator which generates cationic species mainly by heating is used, the amount of the polymerization initiator to be used is preferably 0.05 to 30% by weight, more preferably 0.1 to 15% by weight, especially preferably 0.5 to 10% by weight, based on 100% by weight of the photo-cationically polymerizable compound. When the amount of the polymerization initiator used is less than 0.05% by weight, the curing promotion effect tends to be unsatisfactory. On the other hand, when the amount of the polymerization initiator used exceeds 30% by weight, the compatibility tends to be lowered.

Further, it is preferred that the weight ratio of the polymerization initiator which generates cationic species mainly by irradiation with lights comprising a light having a wavelength of 180 to 750 nm to the polymerization initiator which generates cationic species mainly by heating is 1:50 to 50:1. When the weight ratio falls outside of the above range, the content of the other polymerization initiator is extremely low, so that a sufficiently cured product is possibly not obtained.

When the polymerization initiator which generates cationic species mainly by irradiation with lights comprising a light having a wavelength of 180 to 750 nm and/or the polymerization initiator which generates cationic species mainly by heating is used, these can be used individually or in combination of two or more kinds of several kinds. For promoting the cationic polymerization to improve the curing properties of the adhesive, a sensitizer can be optionally used in combination of two or more kinds. With respect to the sensitizer, there is no particular limitation as long as it can be used for effectively utilizing the absorption wavelength of the excitation light used, and known sensitizers can be used. Specifically, compounds, such as anthracene, phenothiazine, perylene, carbazole, benzophenone, thioxanthone, fluorenone, and anthraquinone, and derivatives thereof can be used.

A film-forming material may be further added to the adhesive. It is preferred that the amount of the film-forming material to be used is 20 to 320 parts by weight, based on 100 parts by weight of the photo-cationically polymerizable compound. When the amount of the film-forming material used is less than 20 parts by weight or exceeds 320 parts by weight, the film-forming properties tend to be poor.

It is preferred that the thermoplastic (hot-melt) adhesive comprises a polymer which basically exhibits an insulating property and imparts general cohesive force to the adhesive, and optionally, a tackifier, a tackiness adjustor, a crosslinking agent, an anti-aging agent, or a dispersant.

As the polymer, ethylene-vinyl acetate copolymers, ethylene-vinyl acetate copolymer modified products, polyethylene, ethylene-propylene copolymers, ethylene-acrylic acid copolymers, ethylene-acrylate copolymers, ethylene-acrylic acid salt copolymers, acrylate rubbers, polyisobutylene, atactic polypropylene, polyvinyl butyral, acrylonitrile-butadiene copolymers, styrene-butadiene block copolymers, styrene-isoprene block copolymers, polybutadiene, ethylene cellulose, polyester, polyamide, polyurethane, natural rubbers, silicone rubbers, synthetic rubbers, such as polychloroprene, and polyvinyl ether can be used individually or in combination of two or more kinds.

Examples of tackifiers include dicyclopentadiene resins, rosin, modified rosin, terpene resins, xylene resins, terpene phenolic resins, alkylphenol resins, and coumarone-indene, resins, and these may be used individually or in combination of two or more kinds, if desired. Representative examples of tackiness adjustors include various plasticizers, such as dioctyl phthalate.

A crosslinking agent is used when it is required to improve a cohesive force of the polymer, and examples include multifunctional substances being capable of reacting with the functional group of the polymer, such as polyisocyanate melamine resins, urea resins, and phenolic resins.

An anti-aging agent is used when it is required to improve the polymer binder in stability against heat, oxygen, or light, and examples include stabilizers such as metal soaps, anti-oxidants such as alkylphenols, and ultraviolet absorbers such as benzophenone and benzotriazole, and these may be used individually or in combination of two or more kinds, if desired.

A dispersant may be used for improving the dispersion properties of particles, and examples include surfactants, and nonionic, cationic, anionic, and ampholytic surfactants can be used individually or in combination of two or more kinds.

Optionally, filler, a softening agent, a promoter, an anti-aging agent, a coloring agent, a flame retardant, or a coupling agent may be added to the adhesive.

EXAMPLES

Hereinbelow, the present invention will be described in more detail with reference to the following Examples, which should not be construed as limiting the scope of the present invention.

Example 1

(1) Surface-Treated Wiring Board

On a glass-epoxy substrate having a thickness of 0.4 mm, circuit electrodes corresponding to the electrode pads of the later-described semiconductor chip were formed from a copper foil having a thickness of 15 µm by an etching process. Poly(4,4'-diphenylenesulfophthalide) of formula (I) wherein R is biphenyl; $R_1$ is H; X is O; and Y is $SO_2$ was dissolved in cyclohexanone to prepare a 6% by weight solution. The above-formed wiring board was dipped in the this solution, and then taken out from the solution and dried by heating to obtain a surface-treated wiring board having formed thereon a polyphthalide layer having a thickness of 0.5 µm.

(2) Semiconductor Chip

As a semiconductor chip, a sample chip having a size of 2 mm×10 mm and having a thickness of 300 µm was used wherein the bonding surface of the chip was coated with silicon nitride having a thickness of 2 µm, and 200 bumps (projecting electrodes) with a size of 50 µm square each having a height of 15 µm were formed over the periphery portions of the chip on the four sides.

(3) Adhesive

Using a phenoxy resin (trade name: PKHC; manufactured by Union Carbide Corporation; average molecular weight: 45,000) as a film-forming material, a liquid epoxy resin containing a microcapsule curing agent (trade name: HX3941HP; manufactured by Asahi Kasei Epoxy Co., Ltd.; heat activation temperature: 120° C., corresponding to DSC peak temperature) as a latent curing agent, and an acrylic rubber as a stress relaxation material and bisphenol A epoxy, a composition, which was obtained by dissolving or dispersing 30 g of the acrylic rubber, 10 g of the phenoxy resin, 10 g of the bisphenol A epoxy, 50 g of the microcapsule curing agent, and 1 g of a silane coupling agent (tradename: SH6040; manufactured by Dow Corning Toray Silicone Co., Ltd.) in toluene-ethyl acetate (50:50 weight ratio), was applied onto a polyethylene terephthalate film (separator) which had been release-treated, and dried (at 80° C. for 5 minutes) to prepare a film-type adhesive having a thickness of 20 µm (the separator is not shown in the Figure).

(4) Connection

The above-prepared film adhesive was disposed between the electrodes of the above surface-treated wiring board and the electrodes of the semiconductor chip. After the electrodes of the wiring board were positioned to the corresponding electrodes of the semiconductor chip, they were pressed at, 5 MPa (50 kg/cm$^2$) for 10 seconds while heating at 180° C. The adhesive between the electrodes was squeezed out and flowed into the space with no bump, so that the electrodes were in contact through poly(4,4'-dipheylenesulfophthalide). The microcapsules of curing agent were broken in the squeezed out adhesive and the adhesive was sufficiently cured (5) Evaluation A contact resistance between the electrodes opposed to each other and an insulation resistance between the adjacent electrodes were measured. As a result, it was found that the connected structure exhibited excellent properties such that the contact resistance was 0.1Ω or less and the insulation resistance was $10^8$Ω or more. In addition, the connected structure exhibited excellent connection reliability such that there was almost no change in the above values after being treated at 85° C. and at 85% RH for 1,000 hours (hereinafter referred to as a high temperature high humidity treatment). The cross-section of the connected structure was polished and examined under a microscope. As a result, the connected structure was found to be as shown in FIG. 7.

Examples 2 to 4 and Comparative Example 1

Substantially the same procedure as in Example 1 was repeated except that the thickness of poly(4,4'-diphenylenesulfophthalide) was changed to 0.03 µm (Example 2), 5 µm (Example 3), and 30 µm (Example 4). The resultant connected structures exhibited a low contact resistance and a high insulation resistance between the adjacent electrodes, as well, as excellent connection reliability after the high temperature and high humidity test. Further, in Comparative Example 1, substantially the same procedure as in Example 1 was repeated except that poly(4,4'-diphenylenesulfophthalide) was not formed. As a result, dispersion of the contact resistances was recognized, namely, there were portions having a high contact resistance, which was thought to be due to corrosion of the electrodes before connection. In addition, with respect to the appearance after the evaluation of reliability, ion migration was observed between the adjacent electrodes, and there were adjacent electrodes having an insulation resistance as low as $10^5 \Omega$.

Examples 5 and 6

Substantially the same procedure as in Example 1 was repeated except that the type of the substrate was changed, specifically, a glass substrate having a thickness of 0.4 mm and having thereon Al electrodes having a thickness of 0.3 μm (Example 5), and a polyimide substrate having thereon 10 μm-thick copper foil etched electrodes (Example 6) were individually used. The resultant connected structures respectively exhibited a low contact resistance and a high insulation resistance between the adjacent electrodes, as well as excellent connection reliability after the high temperature and high humidity test.

Example 7

Substantially the same procedure as in Example 1 was repeated except that the electrodes used in Examples 5 and 6 were connected, that is, a construction of the connected structure was such that polyphthalide was formed on both the electrodes opposed to each other. In this Example, the connected structure exhibited a low contact resistance and a high insulation resistance between the adjacent electrodes, as well as excellent connection reliability after the high temperature and high humidity test.

Examples 8 to 10

Substantially the same procedure as in Example 1 was repeated except that the pressure for connection was changed to 0.05 MPa (Example 8), 0.5 MPa (Example 9), and 10 MPa (Example 10). In each of Examples, the connected structure exhibited a low contact resistance and a high insulation resistance between the adjacent electrodes, as well as excellent connection reliability after the high temperature and high humidity test.

Examples 11 to 13

Substantially the same procedure as in Example 1 was repeated except that the kind of the polyphthalide was changed.

Specifically, in Example 11, polyphthalide of formula (I) was used, wherein: R, $R_1$, X, and Y are respectively the corresponding groups shown as No. 2 in Table 1.

Similarly, in Examples 12 and 13, polyphthalide of formula (I) were used, wherein R, $R_1$, X, and Y are the corresponding groups shown as No. 3 and No. 4 in Table 1 respectively.

TABLE 1

| Example | No. | R | $R_1$ | X | Y | Solvent |
|---|---|---|---|---|---|---|
| 1~10 | 1 | biphenyl (para-para) | —H | O | $SO_2$ | cyclohexanone |
| 11 | 2 | biphenyl (meta-para) | —H | N-phenyl | | CO | nitrobenzene |
| 12 | 3 | biphenyl (para-para) | —H | O | CO | cyclohexanone |
| 13 | 4 | N,N'-di(p-tolyl)pyromellitimide | —H | O | CO | benzonitrile |

In each of Examples 11 to 13, the connected structure exhibited excellent contact resistance and excellent insulation resistance as well as excellent connection reliability after the high temperature and high humidity treatment.

Example 14

(1) Adhesive Film

Using a phenoxy resin (trade name: PKHC; manufactured by Union Carbide-Corporation; average molecular weight: 45,000) as a film-forming material, a liquid epoxy resin containing a microcapsule curing agent (trade name: HX3941HP; manufactured by Asahi Kasei Epoxy Co., Ltd.; heat activation temperature: 120° C., corresponding to DSC peak temperature) as a latent curing agent, and an acrylic rubber as a stress relaxation material and bisphenol A epoxy, 30 g of the acrylic rubber, 10 g of the phenoxy resin, 10 g of the bisphenol A epoxy, 50 g of the microcapsule curing agent, and 1 g of a silane coupling agent (trade name: SH6040; manufactured by Dow Corning Toray Silicone Co. Ltd.) were dissolved or dispersed in toluene-ethyl acetate (50:50 weight ratio), and 3% by volume of the below-described polyphthalide was dispersed therein, based on 100% by volume of the solid content of the resultant composition, and the resultant dispersion was applied onto a polyethylene terephthalate film (separator) which had been release-treated and dried to prepare an adhesive film having a thickness of 20 μm shown in FIG. 8 (the separator is not shown in the Figure).

Powder of poly(4,4'-diphenylenesulfophthalide) of formula (I) wherein R: biphenyl; $R_1$: H; X: O; and Y: $SO_2$ was prepared as follows. Poly(4,4'-diphenylenesulfophthalide) was dissolved in cyclohexanone to prepare a 3% by weight solution, and the prepared solution was added dropwise to methanol (in a 100-fold volume) while vigorously stirring by means of a homogenizer, and the resultant powder was dried in a nitrogen gas atmosphere at 200° C. for 30 minutes, and then classified to give polyphthalide powder having a particle diameter of 0.1 to 3 μm and having an average particle diameter of 1.5 μm.

(2) Wiring Board

On a glass-epoxy substrate having a thickness of 0.4 mm, circuit electrodes corresponding to the electrode pads of the below-described semiconductor chip were formed from a copper foil having a thickness of 15 μm by an etching process.

(3) Semiconductor Chip

As a semiconductor chip, a test chip having a size of 2 mm×10 mm and having a thickness of 300 μm was used wherein the bonding surface of the chip was coated with silicon nitride having a thickness of 2 μm, and 200,bumps (projecting electrodes) with a size of 50 μm square each having a height of 15 μm were formed over the periphery portions of the chip on the four sides.

(4) Connection

The above-prepared adhesive film was disposed between the electrodes of the above-formed wiring board and the electrodes of the semiconductor chip. After the electrodes of the wiring board were positioned to the corresponding electrodes of the semiconductor chip, they were pressed at 5 MPa (50 kg/cm$^2$) for 10 seconds while heating at 180° C. The adhesive between the electrodes was squeezed out and flowed into the space with no bump, so that the circuit electrodes of the wiring board and the electrode of the semiconductor chip were in contact through powders of poly(4,4'-diphenylenesulfophthalide). The microcapsules of curing agent were broken in the squeezed out adhesive and the adhesive was sufficiently cured.

(5) Evaluation

A contact resistance between the electrodes opposed to each other and an insulation resistance between the adjacent electrodes were measured. As a result, it was found that the connected structure exhibited excellent properties such that the contact resistance was 0.1Ω or less and the insulation resistance was $10^8$Ω or more. In addition, the connected structure exhibited excellent connection reliability such that there was almost no change in the above values after the treatment at 85° C. at 85% RH for 1,000 hours (the high temperature and high humidity test). The cross-section of the connected structure was polished and examined under a microscope. As a result, the connected structure was found to be as shown in FIG. 12.

Example 15

Substantially the same procedure as in Example 14 was repeated except that the construction of the adhesive film was changed. Specifically, the construction was changed so as to have a construction as shown in FIG. 9 in which a polyphthalide thin layer was formed on one surface of an adhesive layer. As an adhesive, like in Example 14, using a phenoxy resin (trade name: PKHC; manufactured by Union Carbide Corporation; average molecular weight: 45,000) as a film-forming material, a liquid epoxy resin containing a microcapsule curing agent (trade name: HX3941HP; manufactured by Asahi Kasei Epoxy Co., Ltd.; heat activation temperature: 120° C., corresponding to DSC peak temperature) as a latent curing agent, and an acrylic rubber as a stress relaxation material and bisphenol A epoxy, a composition, which was obtained by dissolving or dispersing 30 g of the acrylic rubber, 10 g of the phenoxy resin, 10 g of the bisphenol A epoxy, 50 g of the microcapsule curing agent, and 1 g of a silane coupling agent (trade name: SH6040; manufactured by Dow Corning Toray Silicone Co., Ltd.) in toluene-ethyl acetate (50:50 weight ratio), was applied onto a polyethylene terephthalate film (separator) which had been release-treated and dried to prepare an adhesive having a thickness of 20 μm (the separator is not shown in the Figure). Separately, a 6% by weight solution prepared by dissolving poly(4,4'-diphenylenesulfophthalide) as polyphthalide in cyclohexanone was applied onto a polyethylene terephthalate film (separator) which had been release-treated, and dried at 100° C. to form a polyphthalide thin layer having a thickness of 2 μm. The above-prepared adhesive and the polyphthalide thin layer were laminated (at 80° C.) using a laminator so that the adhesive layer and the polyphthalide thin layer face each other to obtain an adhesive film having the polyphthalide thin layer formed on the adhesive layer (having a construction as shown in FIG. 9, wherein the separator is not shown).

Using the same wiring board as in Example 14, the separator formed on the adhesive layer side was peeled off, and the adhesive surface was pressed to the wiring board at 5 MPa (50 kg/cm$^2$) for 15 seconds while heating to 180° C. so that the spaces between the adjacent circuit electrodes on the wiring board were individually filled with the adhesive and the polyphthalide thin layer was arranged as the uppermost surface as shown in FIG. 13. Using the same semiconductor chip as used in Example 14, the chip was disposed on the polyphthalide thin layer side, and then, a contact resistance and an insulation resistance were measured at room temperature (23° C.) while applying a pressure of 0.3 MPa per bump. As a result, excellent values were obtained such that the contact resistance was 0.1Ω or less and the insulation resistance was $10^8$Ω or more. Thus, this method is advantageously used for, for example, preliminarily evaluating the electrical properties of a semiconductor chip (so-called KGD chip).

Example 16

Substantially the same procedure as in Example 14 was repeated except that the construction of the adhesive film was changed to a construction as shown in FIG. 10. Specifically, a 6% by weight solution prepared by dissolving poly(4,4'-diphenylenesulfophthalide) as polyphthalide in cyclohexanone was applied to a polyethylene terephthalate film (separator) which had been release-treated, and dried at 100° C. to form a polyphthalide thin layer having a thickness of 2 μm. A negative photosensitive film having a thickness of 25 μm was laminated onto the polyphthalide thin layer, and a mask having transparent hole portions with a diameter of 100 μm at a rate of 10 holes/mm² was placed thereon. Subsequently, they are subjected to exposure and development, followed by after-exposure and after-heating. Then, the exposed portions were dissolved in cyclohexanone and the photosensitive film was peeled off. To the resultant surface was applied the same adhesive as used in Example 14 (excluding polyphthalide), and they are dried (at 80° C. for 5 minutes) to form an adhesive film having a thickness of 20 μm.

Using the thus formed adhesive film and the same wiring board and semiconductor chip as used in Example 14, the adhesive film was disposed between the electrodes of the wiring board and the electrodes of the semiconductor chip so that the adhesive layer in the adhesive film faced the wiring board. After the electrodes on the wiring board were positioned to the corresponding electrodes on the semiconductor chip, they were pressed at 5 MPa (50 kg/cm²) for 10 seconds while heating at 180° C.

The same evaluations as in Example 14 were made, and it was found that the connected structure exhibited excellent contact resistance (0.32Ω) and excellent insulation resistance (10⁸Ω or more) as well as excellent connection reliability after the high temperature and high humidity test. The connected structure in this Example has a cross-section of the connection shown in FIG. 14, and the adhesive flowed beyond the polyphthalide thin layer to reach the other side when they were heated and pressed for connection, so that the bonding on this surface with the adhesive was made possible, thereby the electrodes opposed to each other can be fixed by the adhesive. That is, the electronic parts facing each other could be connected electrically and mechanically.

Example 17

Substantially the same procedure as in Example 14 was repeated except that the construction of the adhesive film was changed to a construction as shown in FIG. 11, in which polyphthalide having a thickness of 2 μm was sandwiched between adhesive films each having a thickness of 15 μm corresponding to the height of the electrodes. As an adhesive, the same adhesive as used in Example 14 (excluding polyphthalide) was applied onto a surface treated polyethylene terephthalate film (separator) and dried (at 70° C. for 10 minutes) to prepare an adhesive (separator is not shown in the Figure) having a thickness of 15 μm. Separately, a 6% by weight solution prepared by dissolving poly(4,4'-diphenylenesulfophthalide) as polyphthalide in cyclohexanone was applied to a polyethylene terephthalate film (separator) which had been release treated, and dried at 100° C. to form a polyphthalide thin layer having a thickness of 2 μm. The above prepared adhesive and the polyphthalide thin layer were laminated (at 80° C.) using a laminator so that the adhesive layer and the polyphthalide thin layer faced each other to give an adhesive film having the polyphthalide thin layer formed on the adhesive layer. Further, the resultant laminate product comprising the adhesive layer and the polyphthalide thin layer was laminated (at 80° C.) onto another adhesive layer to obtain an adhesive film having a construction as shown in FIG. 11.

The thus obtained adhesive film was disposed between the same wiring board and the semiconductor chip as used in Example 14, and the electrodes of the wiring board were positioned to the corresponding electrodes of the semiconductor chip, and they were pressed together at 5 MPa (50 kg/cm²) for 10 seconds while heating to 180° C. The resultant connected structure had a construction as shown in FIG. 15, and exhibited excellent contact resistance (0.7Ω) and excellent insulation resistance (10⁸Ω or more), as well as excellent connection reliability after the high temperature and high humidity test. This Example showed that connection of the substrates through the polyphthalide thin layer was possible.

Examples 18 to 20

Substantially the same procedure as in Example 14 was repeated except that the kind of the polyphthalide was changed.

Specifically, in Example 18, polyphthalide of formula (I) was used, wherein R, $R_1$, X, and Y are, respectively, the corresponding groups shown as No. 2 in Table 2.

Similarly, in Examples 19 and 20, polyphthalide of formula (I) was used, wherein R, $R_1$, X, and Y are the corresponding groups shown as No. 3 and No. 4 in Table 2, respectively.

TABLE 2

| Example | No. | R | $R_1$ | X | Y | Solvent |
|---|---|---|---|---|---|---|
| 14–17 | 1 | —⟨phenyl⟩—⟨phenyl⟩— | —H | O | SO₂ | cyclohexanone |
| 18 | 2 | —⟨phenyl⟩—⟨phenyl⟩— | —H | N—⟨phenyl⟩ | CO | nitrobenzene |
| 19 | 3 | —⟨phenyl⟩—⟨phenyl⟩— | —H | O | CO | cyclohexanone |

TABLE 2-continued

| Example | No. | R | $R_1$ | X | Y | Solvent |
|---|---|---|---|---|---|---|
| 20 | 4 | (pyromellitic diimide with two p-tolyl groups) | —H | O | CO | benzonitrile |

In each of Examples 18 to 20, the connected structure exhibited excellent contact resistance (1Ω or less) and excellent insulation resistance ($10^8$Ω or more), as well as excellent connection reliability after the high temperature and high humidity treatment.

Example 21

50 g of a phenoxy resin (trade name: PKHC; manufactured by Union Carbide Corporation; average molecular weight: 45,000) as a film-forming material, 48 g of dicyclohexyl methacrylate as a radically polymerizable compound, 2 g of phosphate acrylate as a phosphate compound, and 3 g of 2,5-dimethyl-2,5-bis(2-ethylhexanoylperoxy)hexane as an organic peroxide were dissolved in 3 g of methyl ethyl ketone as a solvent, and further, 3% by volume of the same polyphthalide powder as that used in Example 14 was dispersed in the resultant solution. The resultant dispersion was applied to a polyethylene terephthalate film having one surface treated and having a thickness of 50 μm using a coating machine, and dried at 70° C. for 10 minutes to obtain an adhesive film having a thickness of 30 μm. Then, the thus obtained adhesive film was disposed between the same wiring board and semiconductor chip as those used in Example 14, and the electrodes on the wiring board were positioned to the corresponding electrodes on the semiconductor chip, and then they were together pressed at 4MPa for 20 seconds while heating to 150° C. The resultant connected structure exhibited excellent properties such that the contact resistance was 0.1Ω or less and the insulation resistance was $10^8$Ω or more. In addition, the connected, structure exhibited excellent connection reliability such that there was almost no change in each of the above values after the treatment at 85° C. at 85% RH for 1,000 hours.

Example 22

50 g of a bisphenol A epoxy resin (trade name: EPIKOTE 828; manufactured by Yuka Shell Epoxy Kabushiki Kaisha; epoxy equivalent: 184) as a photo-cationically polymerizable compound, 1.0 g of a 50% by weight propylene carbonate solution of a triarylsulfonium hexafluorophosphate mixture (trade name: CYRACURE UVI-6990; manufactured by Union Carbide Corporation) as a polymerization initiator which generates cationic species mainly by irradiation with lights comprising a light having a wavelength of 180 to 750 nm, and 3.0 g of a 50% by weight ethyl acetate solution of benzylsulfonium hexafluoroantimonate (trade name: SAN-AID SI-60L; manufactured by SANSHIN CHEMICAL INDUSTRY, CO., LTD.) as a polymerization initiator which generates cationic species mainly by heating were used. 50 g of a bisphenol A-F copolymer phenoxy resin (average molecular weight: 20,000) as a film-forming material was used, and further, 3% by volume of the same polyphthalide powder as used in Example 14 was dispersed therein. The resultant dispersion was applied onto a polyethylene terephthalate film surface-treated on one surface and having a thickness of 50 μm using a coating machine, and dried at 70° C. for 10 minutes to give an adhesive film having a thickness of 25 μm.

A flexible printed circuit board (FPC; insulating substrate: polyimide film; thickness: 125 μm) having 500 copper circuits each having a line width of 50 μm, a pitch of 100 μm, and a thickness of 18 μm, and a glass (thickness: 1.1 mm; surface resistance: 20Ω having formed thereon a 0.2 μm indium tin, oxide (ITO) thin film were pressed together at 2 MPa for 20 seconds while heating at 120° C. and simultaneously irradiating with ultraviolet lights, using an ultraviolet radiation type thermocompression bonding machine (heating system; constantly heating mode; manufactured by Toray Engineering Co., Ltd.) to bond them over a width of 2 mm, and, after a lapse of a predetermined time, the pressure was released to prepare a connected structure. The dose of the ultraviolet radiation for the circuit connection materials was 2.0 J/cm². In this case, the adhesive surface of the adhesive film was preliminarily placed on the ITO film on the glass, and then temporarily bonded by pressing at 0.5 MPa for 5 seconds while heating at 70° C. Then, the PET film was peeled off, and the film surface comprising the adhesive film was irradiated with ultraviolet lights at 2.0 J/cm² using an ultraviolet radiation machine equipped with a high-pressure mercury lamp (manufactured by USHIO INC.). Then, the electrodes were positioned to the corresponding electrodes of the FPC and connected to give a connected structure. In the operation of connection for 20 seconds, the first 3 seconds were only for heating and pressing, and, after the 3 seconds, ultraviolet radiation was carried out for 17 seconds, so that these two operations were simultaneously terminated after 20 seconds from the start of the heating and pressing. The connected structure exhibited excellent properties such that the contact resistance was 1Ω or less and the insulation resistance was $10^8$Ω or more. In addition, the connected structure exhibited excellent connection reliability such that there was almost no change in the above values after the treatment at 85° C. at 85% RH for 1,000 hours.

Example 23

In an adhesive solution comprising 60 parts by weight of Tufprene (trade name; styrene-butadiene block polymer, manufactured by Asahi Kasei-Corporation), 40 parts by weight of YS Polyster T-115 (trade name terpene phenolic resin, manufactured by Yasuhara Yushi Kogyo Co. Ltd.), and 200 parts by weight of toluene, 3% by volume the same polyphthalide powder as used in Example 14 was dispersed. The resultant dispersion was applied onto a polyethylene terephthalate film having surface-treated on one surface and having a thickness of 50 μm using a coating machine, and dried at 100° C. for 20 minutes to give an adhesive film having a thickness of 25 μm. Then, the thus obtained adhesive film was disposed between the same wiring board and semiconductor chip as used in Example 14, and the electrodes of the wiring board were positioned to the corresponding electrodes of the semiconductor chip, and then they were pressed together at 3 MPa for 20 seconds while heating at 150° C. The resultant connected structure exhibited excellent properties such that the contact resistance was 0.1Ω or less and the insulation resistance was $10^8 \Omega$ or more. In addition, the connected structure exhibited excellent connection reliability such that there was almost no change in the above values after the treatment at 85° C. at 85% RH for 1,000 hours.

Reference Example 1

As an adhesive, like in Example 14, using a phenoxy resin (trade name: PKHC; manufactured by Union Carbide Corporation; average molecular weight: 45,000) as a film-forming material, a liquid epoxy resin containing a microcapsule curing agent (trade name: HX3941HP; manufactured by Asahi Kasei Epoxy Co., Ltd.; heat activation temperature: 120° C., corresponding to DSC peak temperature) as a latent curing agent, and an acrylic rubber as a stress relaxation material and bisphenol A epoxy, 3% by volume of conductive particles (particles comprising polystyrene as a core, a 0.2 μm-thick nickel layer formed on the surface of the core, and a 0.04 μm-thick gold layer formed on the outer surface of the nickel layer, and having an average particle diameter of 5 μm) was dispersed in a composition, which was obtained by dissolving or dispersing 30 g of the acrylic rubber, 10 g of the phenoxy resin, 10 g of the bisphenol A epoxy, 50 g of the microcapsule curing agent, and 1 g of a silane coupling agent (trade name: SH6040; manufactured by Dow Corning Toray Silicone Co., Ltd.) in toluene-ethyl acetate (50:50 weight ratio), and the resultant dispersion was applied onto a polyethylene terephthalate film (separator) which had been release-treated and dried to prepare an adhesive film having a thickness of 20 μm (the separator is not shown in the Figure)

The thus prepared adhesive film was disposed between the same wiring board and semiconductor chip as used in Example 14, and the electrodes of the wiring board were positioned to the corresponding electrodes of the semiconductor chip, and then they were pressed together at 5 MPa (50 kg/cm$^2$) for 10 seconds while heating at 180° C.

The same evaluations as in Example 14 were made, and it was found that the connected structure exhibited excellent contact resistance (1Ω or less) and excellent insulation resistance ($10^8 \Omega$ or more), as well as excellent connection reliability after the high temperature and high humidity test.

As mentioned above, by using polyphthalide in electrical connection of electrodes, not only can a low contact resistance be achieved without using conventional conductive particles, but also the low contact resistance can be maintained even after exposed to a high temperature and high humidity atmosphere. Further, the polyphthalide exhibits an insulating property in the surface direction. By applying a pressure to polyphthalide in the thickness direction, the polyphthalide is slightly deformed, so that an insulating property of the polyphthalide are changed to electric conductivity. Therefore, by applying a pressure to electrodes to be connected while fixing the electrodes through an adhesive, electrical connection can be secured. On the other hand, no pressure is applied between the adjacent electrodes in the surface direction, and therefore they maintain an insulating property. When polyphthalide in the form of particles is dispersed in the adhesive, no pressure in the surface direction is applied to the adjacent electrodes and therefore they maintain an insulating property. For example, even though the polyphthalide particles are in contact, no pressure is applied to the polyphthalide particles and the particles are not deformed, and hence they exhibit an insulating property. The same effect can be attained by the conventional conductive particles coated with an insulating material, but the present invention has advantages in that neither conduction, treatment nor coating with an insulating material is needed, and there is no need for caring about the insulating material to have a uniform thickness.

INDUSTRIAL APPLICABILITY

By using the adhesive film of the present invention comprising an adhesive and polyphthalide as a pressure-sensitive conductive polymer, both electrical connection by pressure and fixing by an adhesive can be achieved simultaneously by the same operation, thus rendering the process for connection extremely easy. In addition, application of a pressure to polyphthalide in the thickness direction causes the polyphthalide as a pressure-sensitive conductive polymer to exhibit electric conductivity, thus making it possible to connect electrodes with a high density and a high precision, depending on the pitch of the electrodes. Further, by virtue of having polyphthalide as a pressure-sensitive conductive polymer formed on the electrode surface, excellent connection can be made between the electrodes even when the electrodes have uneven heights, and an electrodes-connected structure having excellent reliability can be extremely easily obtained.

Furthermore, when the surface-treated wiring board of the present invention is used, polyphthalide as a pressure-sensitive conductive polymer serves as both an anti-corrosion agent for the electrode surface and a pressure-sensitive conductive material in the thickness direction. Therefore, a step of removing the anti-corrosion agent by cleaning is not required, which has been required if the anti-corrosion agent is used. In addition, polyphthalide itself functions as a pressure-sensitive conductive material in the thickness direction, and hence no conductive particles are needed for connecting electrodes. Therefore, electrodes with an increased density and precision can be extremely easily connected.

What is claimed is:

1. A surface-treated wiring board comprising a substrate and at least one electrode part, wherein a polyphthalide layer is formed on at least part of the surface of the electrode part, and wherein the polyphthalide layer is made of a polyphthalide represented by the formula (I):

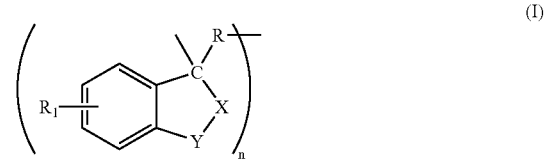

wherein R represents a divalent aromatic hydrocarbon group or a divalent heteroring-containing aromatic group, $R_1$ represents an alkyl group, a fluorinated alkyl group, an alkoxy group or a halogen atom, where the number of $R_1$ is 0 to 4, X represents O or N—$R_3$, provided that $R_3$ represents one of the following groups,

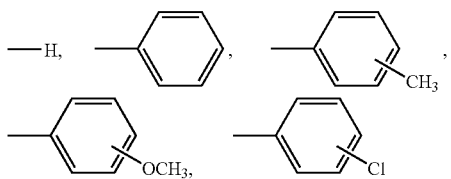

Y represents SO₂ or CO and n represents a number of repeating units in the polymer.

2. The electrode-connected structure according to claim 1, wherein the polyphthalide is a pressure-sensitive conductive polymer.

3. An electrode-connected structure, wherein a polyphthalide layer is interposed between electrodes opposed to each other and the both electrodes are fixed by pressure, and wherein the polyphthalide layer is made of a polyphthalide represented by the formula (I):

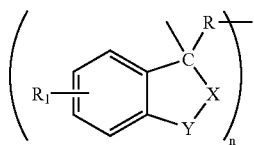

wherein R represents a divalent aromatic hydrocarbon group or a divalent heteroring-containing aromatic group, $R_1$ represents an alkyl group, a fluorinated alkyl group, an alkoxy group or a halogen atom, where the number of $R_1$ is 0 to 4, X represents O or N—$R_3$, provided that $R_3$ represents one of the following groups,

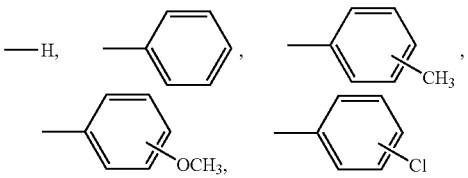

Y represents SO₂ or CO and n represents a number of repeating units in the polymer.

4. The electrode-connected structure according to claim 3, wherein the both electrodes are fixed by an adhesive.

5. The electrode-connected structure according to claim 4, wherein the both electrodes are fixed by an adhesive present in the adhesive film comprising an adhesive and polyphthalide.

6. The electrode-connected structure according to claim 3, wherein the both electrodes are fixed by a mechanical means.

7. The electrode-connected structure according to claim 3, wherein the polyphthalide is a pressure-sensitive conductive polymer.

* * * * *